United States Patent
Tanizaki

(10) Patent No.: US 6,310,808 B1
(45) Date of Patent: Oct. 30, 2001

(54) SEMICONDUCTOR MEMORY DEVICE HAVING STRUCTURE FOR HIGH-SPEED DATA PROCESSING

(75) Inventor: Hiroaki Tanizaki, Hyogo (JP)

(73) Assignees: Mitsubishi Denki Kabushiki Kaisha; Mitsubishi Electric Engineering Company Limited, both of Tokyo (JP)

( * ) Notice: Subject to any disclaimer, the term of this patent is extended or adjusted under 35 U.S.C. 154(b) by 0 days.

(21) Appl. No.: 09/613,503

(22) Filed: Jul. 10, 2000

(30) Foreign Application Priority Data

Jan. 21, 2000 (JP) .................................................. 12-013107

(51) Int. Cl.[7] ...................................................... G11C 7/00
(52) U.S. Cl. ....................................... 365/203; 365/189.01
(58) Field of Search ..................................... 365/195, 203, 365/189.01, 233

(56) References Cited

U.S. PATENT DOCUMENTS

| | | | | |
|---|---|---|---|---|
| 5,511,025 | * | 4/1996 | Smith et al. ..................... | 365/189.05 |
| 5,528,551 | * | 6/1996 | Pinkham ......................... | 365/230.06 |
| 5,594,704 | * | 1/1997 | Konichi et al. ....................... | 365/203 |
| 6,091,667 | * | 7/2000 | Tanaka et al. ..................... | 365/238.5 |
| 6,125,065 | * | 9/2000 | Aikawa et al. ...................... | 365/195 |

* cited by examiner

*Primary Examiner*—Son T. Dinh
(74) *Attorney, Agent, or Firm*—McDermott, Will & Emery

(57) ABSTRACT

The semiconductor memory device separates data input/output lines into a pair of write data lines and a pair of read data lines. A write gate is turned on with a column selection signal for writing, and a read gate is turned on with a column selection signal for reading. The pair of write data lines are not precharged but only the pair of read data lines are precharged in a transition to each operation. The pair of write data lines are precharged with a write mask signal in write masking. Thus, high-speed data processing is implemented.

20 Claims, 27 Drawing Sheets

SEMICONDUCTOR MEMORY DEVICE HAVING STRUCTURE FOR HIGH-SPEED DATA PROCESSING

BACKGROUND OF THE INVENTION

1. Field of the Invention

The present invention relates to a semiconductor memory device, and more particularly, it relates to the structures of a data input/output gate and a write driver.

2. Description of the Prior Art

A system LSI (large scale integrated circuit) having a memory core part (synchronous semiconductor memory device) and a logic circuit controlling the memory core part on the same substrate is developed. The memory core part includes hundreds of data input/output terminals (DQ terminals), for improving the data transfer rate between the same and the logic circuit.

A principal part of such a conventional memory core part is described with reference to FIG. 24. Referring to FIG. 24, symbol MC denotes memory cells, symbols WL0 to WL2 denote word lines, and each of symbols BL(0:n) and /BL(0:n) denotes a plurality of bit lines respectively. Symbols DQ(0), DQ(1), . . . , DQ(7) denote data input/output terminals for inputting/outputting data (or input/output data), and symbols GIO(0), /GIO(0), GIO(1), /GIO(1), . . . , GIO(7), /GIO(7) denote data input/output lines.

A row decoder 914 outputs a word line activation signal for selecting any word line of a memory cell array MA. Another row decoder 915 outputs another word line activation signal for selecting any word line of a memory cell array MB. When either word line activation signal is activated, data is read on any bit line from any memory cell MC or written in any memory cell MC from any bit line. A row decoder (SA)/column decoder 916 outputs a signal for controlling an S/A zone 930.

A GIO line write driver/read amplifier zone 904 includes GIO line write drivers/read amplifiers 910A, 910B, . . . , 910H. Each of the GIO line write drivers/read amplifiers 910A, 910B, . . . , 910H is arranged for each of the data input/output terminals DQ(0) to DQ(7).

The S/A zone 930 includes SA/input/output circuit blocks 902A, 902B, . . . , 902H. Each of the SA/input/output circuit blocks 902A, 902B, . . . , 902H includes a plurality of sets of sense amplifiers and input/output circuits.

A write mask signal WM is input when no data is rewritten in only a certain bit in a write operation. The 1-bit write mask signal WM controls the 8-bit data input/output lines GIO(0), /GIO(0), . . . GIO(7), /GIO(7).

The structure of each SA/input/output circuit block is described with reference to FIG. 25. FIG. 25 shows the S/A input/output circuit block 902A, for example. The SA/input/output circuit block 902A includes a plurality of blocks SAX0, . . . , SAXn. Each of the blocks SAX0, . . . , SAXn includes a sense amplifier SA, an equalization circuit EQ and NMOS transistors TLa, TLb, TRa and TRb.

The sense amplifier SA is activated in response to sense amplifier activation signals SE and /SE. The sense amplifier SA includes a cross-coupled latch amplifying read data read from any memory cell and a circuit transferring write data to any bit line. The equalization circuit EQ equalizes any pair of bit lines in response to a bit line equalization signal BLEQ.

A gate formed by the transistors TLa and TLb is turned on by a signal SHRL for connecting the SA/input/output circuit block 902A with the memory cell array MA. A gate formed by the transistors TRa and TRb is turned on by a signal SHRR for connecting the SA/input/output block 902A with the memory cell array MB. The two memory cell arrays MA and MB share the sense amplifier SA through these gates.

Each of the blocks SAX0, . . . , SAXn further includes an input/output circuit controlled by a column selection signal CSL. For example, the block SAX0 includes an input/output circuit formed by NMOS transistors Q0 and /Q0, and the block SAXn includes an input/output circuit formed by NMOS transistors Qn and /Qn.

The transistors Q0 and /Q0 receive a column selection signal CSL(0) in the gates thereof while the transistors Qn and /Qn receive a column selection signal CSL(n) in the gates thereof.

In a read operation, one of n sense amplifiers SA is selected by the column selection signals CSL(0) to CSL(n). Selected read data is transferred to any pair of data input/output lines. In the write operation, write data is transferred from a sense amplifier selected by the column selection signals CSL(0) to CSL(n) to any bit line. Thus, the data is written in any memory cell.

The structure of each GIO line write driver/read amplifier is now described with reference to FIG. 26. The GIO line write driver/read amplifier 910 shown in FIG. 26 includes a GIO line write driver 950 for the write operation, a read amplifier 952 for the read operation and a GIO line equalization circuit 954.

The GIO line write driver 950 includes inverters IV91 to IV95, NAND circuits NA91 and NA92, NMOS transistors T92 and T94 and PMOS transistors T91 and T93.

The NAND circuit NA91 receives write data WD and a write mask signal /WM obtained by inverting the write mask signal WM in the inputs thereof, and the NAND circuit NA92 receives output of the inverter IV91 inverting the write data WD and the write mask signal /WM in the inputs thereof. The inverter IV92 inverts the output of the NAND circuit NA91, and the inverter IV93 inverts the output of the inverter IV92. The inverter IV94 inverts the output of the NAND circuit NA92, and the inverter IV95 inverts the output of the inverter IV94.

The transistors T91 and T92 are connected between a node receiving a power supply voltage Vcc and a node receiving a ground voltage. The transistors T93 and T94 are connected between a node receiving the power supply voltage Vcc and a node receiving the ground voltage. The gates of the transistors T91 and T92 receive the outputs of the inverter IV93 and IV92 respectively, and the gates of the transistors T93 and T94 receive the outputs of the inverter IV95 and IV92 respectively. The data input/output line GIO is connected with the node between the transistors T91 and T92, and the data input/output line /GIO is connected with the node between the transistors T93 and T94.

The GIO line equalization circuit 954 includes PMOS transistors T95, T96 and T97 receiving a signal GIOEQ in the gates thereof. The transistor T95 is connected between the data input/output lines GIO and /GIO. The transistor T96 is connected between the data input/output line GIO and a node receiving the power supply voltage Vcc, and the transistor T97 is connected between the node receiving the power supply voltage Vcc and the data input/output line /GIO. The pair of data input/output lines GIO and /GIO are equalized in response to the signal GIOEQ.

The read amplifier 952 differentially amplifies data of the pair of data input/output lines GIO and /GIO and outputs read data RD.

In the write operation, the write mask signal /WM is set high. When the write data WD is high, the data input/output line GIO goes high and the data input/output line /GIO goes low. When the write data WD is low, the data input/output line GIO goes low and the data input/output line /GIO goes high.

In the read operation, the write mask signal /WM is set low for bringing the GIO line write driver 950 into a floating state. Read data of a bit line selected by the column selection signal CSL is transferred to the pair of data input/output lines GIO and /GIO. The read amplifier 952 amplifies complementary data received from the pair of data input/output lines GIO and /GIO. Thereafter the GIO line equalization circuit 954 precharges the pair of data input/output lines GIO and /GIO high, to prepare for reading next data.

The write operation/read operation in the conventional semiconductor memory device is described with reference to FIG. 27. At a time t1, the signal GIOEQ and the write mask signal /WM go high. The write data WD is transferred to the pair of data input/output lines GIO and /GIO. The write data WD is high and hence the data input/output line /GIO goes low.

The column selection signal CSL is set high at a time t1-1. The potentials of the pair of bit lines BL and /BL change in response to the pair of data input/output lines GIO and /GIO. Thus, the potentials of the pair of bit lines BL and /BL are inverted so that the write data WD is stored in the selected memory cell (write operation). At a time t1-2, the signal GIOEQ and the write mask signal /WM go low and the pair of data input/output lines GIO and /GIO are precharged for making a transition to the next operation.

After the write operation at a time t2, the signal GIOEQ and the write mask signal /WM are set low for precharging the pair of data input/output lines GIO and /GIO and making a transition to the next operation.

In the read operation, the signal GIOEQ is set high(time t3), for stopping equalization by the GIO line equalization circuit 954. The write mask signal /WM is low.

The column selection signal CSL is set high at a time t3-1, for transferring a low-level signal to the pair of data input/output lines GIO and /GIO from either the bit line BL or the bit line /BL. When the bit line BL is low, for example, the data input/output line GIO is driven low while the data input/output line /GIO is kept high. Thus, a voltage difference arises between the data input/output lines GIO and /GIO. The read amplifier 952 amplifies this voltage difference and outputs the same.

In write masking (performing no data writing), the signal GIOEQ is set high and the write mask signal /WM is kept low similarly to the read operation. The pair of data input/output lines GIO and /GIO are precharged high and hence the potentials of the pair of bit lines BL and /BL are not inverted.

In the conventional semiconductor memory device, however, the pair of data input/output lines GIO and /GIO used for the read operation and the write operation must necessarily be precharged after the write operation. If the pair of data input/output lines GIO and /GIO are not completely precharged, the read amplifier 952 disadvantageously amplifies false data in the next read operation.

A synchronous semiconductor memory device operating in synchronization with an external clock has a function of performing a burst operation for continuously inputting/outputting data. Therefore, the data must be written or read at a determined frequency.

However, the conventional structure requires the precharge time as described above, and hence it is difficult to increase the speed of the operation cycle.

SUMMARY OF THE INVENTION

Accordingly, an object of the present invention is to provide a semiconductor memory device capable of high-speed data processing.

A semiconductor memory device according to the present invention comprises a memory cell array including a plurality of memory cells arranged in rows and columns, a plurality of word lines and a plurality of pairs of bit lines, a selection circuit selecting a memory cell subjected to a write operation/read operation from the plurality of memory cells, a pair of write data lines for transferring write data to the memory cell array, a pair of read data lines for transferring data read from the memory cell array and a write driver driving the pair of write data lines in response to the write data and precharging the pair of write data lines in response to a write mask signal in the write operation.

Preferably, the semiconductor memory device further comprises a plurality of write gates arranged correspondingly to said plurality of pairs of bit lines for transferring data of the pair of write data lines to the corresponding pairs of bit lines and a plurality of read gates arranged correspondingly to said plurality of pairs of bit lines for transferring data of the corresponding pairs of bit lines to the pair of read data lines, and the selection circuit outputs a first selection signal for turning on a selected write gate in the write operation while outputting a second selection signal for turning on a selected read gate in the read operation.

In particular, the semiconductor memory device further comprises a plurality of sense amplifiers provided in correspondence to the plurality of pairs of bit lines respectively, and each of the plurality of sense amplifiers decides the potentials of the corresponding pair of bit lines in response to the potential difference between the pair of write data lines when the corresponding write gate is turned on, while deciding the potentials of the pair of read data lines in response to the potential difference between the corresponding pair of bit lines when the corresponding read gate is turned on. The semiconductor memory device further comprises an equalization circuit for equalizing the pair of read data lines.

Thus, the aforementioned semiconductor memory device separates a pair of data input/output lines into the pair of write data lines and the pair of read data lines and precharges the pair of write data lines only in write masking. Consequently, the data input/output lines may not be reset every operation but a high-speed operation is guaranteed dissimilarly to the prior art. When applying the semiconductor memory device to a system LSI having a logic circuit and a memory core part on the same substrate, the data transfer rate can be improved in particular.

When performing a burst operation for continuously inputting/outputting data, the operating cycle can be reduced due to reduction of the precharge time.

As to the pair of read data lines, false reading can be prevented due to the equalization circuit.

Preferably, the semiconductor memory device further comprises a clock generation circuit receiving an external clock and generating an internal clock controlling an internal operation and a write mask circuit settling the write mask signal asynchronously with the internal clock during a setup period preceding the edge of the internal clock, and the write driver receives the output of the write mask circuit and precharges the pair of write data lines.

Thus, the aforementioned semiconductor memory device comprises the circuit capturing and settling the write mask signal asynchronously with the internal clock. Thus, the pair of write data lines can be precharged in the setup period. Consequently, a malfunction resulting from insufficient precharging of the pair of write data lines is prevented in write masking.

Preferably, the pair of write data lines include a first pair of write data lines and a second pair of write data lines, the plurality of pairs of bit lines include a first pair of bit lines and a second pair of bit lines, the semiconductor memory device further comprises a first write gate for transferring data of the first pair of write data lines to the first pair of bit lines and a second write gate for transferring data of the second pair of write data lines to the second pair of bit lines, the selection circuit includes circuit outputting a column address signal in response to an address signal and a circuit outputting a signal for turning on the first write gate and the second write gate in response to the column address signal in the write operation, and the write driver precharges the second pair of write data lines when the first pair of bit lines are selected while precharging the first pair of write data lines when the second pair of bit lines are selected on the basis of the column address signal.

In particular, the semiconductor memory device further comprises a first sense amplifier provided in correspondence to the first pair of bit lines and a second sense amplifier provided in correspondence to the second pair of bit lines, the first sense amplifier decides the potentials of the first pair of bit lines in response to the potential difference between the first pair of write data lines when the first write gate is turned on, and the second sense amplifier decides the potentials of the second pair of bit lines in response to the potential difference between the second pair of write data lines when the second write gate is turned on.

Thus, the aforementioned semiconductor memory device assigns a single column selection signal to two pairs of write data lines. The semiconductor memory device precharges one of the two pairs of write data lines while performing the write operation with the remaining pair of write data lines. Consequently, the number of signal lines transmitting the column selection signal can be reduced, whereby the layout area is reduced.

Preferably, the semiconductor memory device further comprises a precharge control circuit generating a precharge control signal for precharging the write data at prescribed timing, and the write driver precharges the pair of write data lines high in response to the write mask signal and the precharge control signal.

In particular, the pair of write data lines include a first write data line and a second write data line, the prescribed timing is in a refresh mode for refreshing the memory cell array, and the write driver includes a PMOS transistor connected between a first power supply voltage and the first write data line and controlled on/off in response to the write data, the write mask signal and the precharge control signal and an NMOS transistor connected between a second power supply voltage lower than the first power supply voltage and the second write data line and controlled on/off in response to the write data, the write mask signal and the precharge control signal.

Alternatively, the prescribed timing is in a standby mode stopping the write operation/read operation of the memory cell array.

Thus, the aforementioned semiconductor memory device precharges the pair of write data lines high at the prescribed timing. Thus, leakage current from the PMOS transistor in the final stage of the write driver can be prevented for reducing a subthreshold current. In particular, the semiconductor memory device precharges the write data lines high in the standby mode or the refresh mode.

Preferably, the semiconductor memory device further comprises an equalization circuit for equalizing the pair of write data lines in response to the write mask signal.

In particular, the pair of write data lines include a first write data line and a second write data line, and the equalization circuit includes a switch electrically connecting the first write data line with the second write data line in response to the write mask signal. Alternatively, the equalization circuit includes a switch supplying a power supply voltage to the first write data line and the second write data line in response to the write mask signal.

Thus, the aforementioned semiconductor memory device comprises the circuit equalizing the pair of write data lines by electrically connecting the pair of write data lines or supplying the power supply voltage to the pair of write data lines in write masking. Thus, the pair of write data lines can be set high at a high speed.

In particular, the semiconductor memory device further comprises a control circuit controlling the write driver to start precharging the pair of write data lines when starting the write operation and continue the precharging when the write mask signal is subsequently input while stopping the precharging and driving the pair of write data lines on the basis of the write data when no write mask signal is input. The control circuit controls the write driver to start precharging the pair of write data lines when starting the write operation and stop the precharging for driving the pair of write data lines on the basis of the write data when no write mask signal is subsequently input.

Thus, the aforementioned semiconductor memory device precharges the pair of write data lines when starting the write operation and continues the precharging in response to the subsequently input write mask signal or stops the precharging for transferring data. Consequently, data processing can be performed at a high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
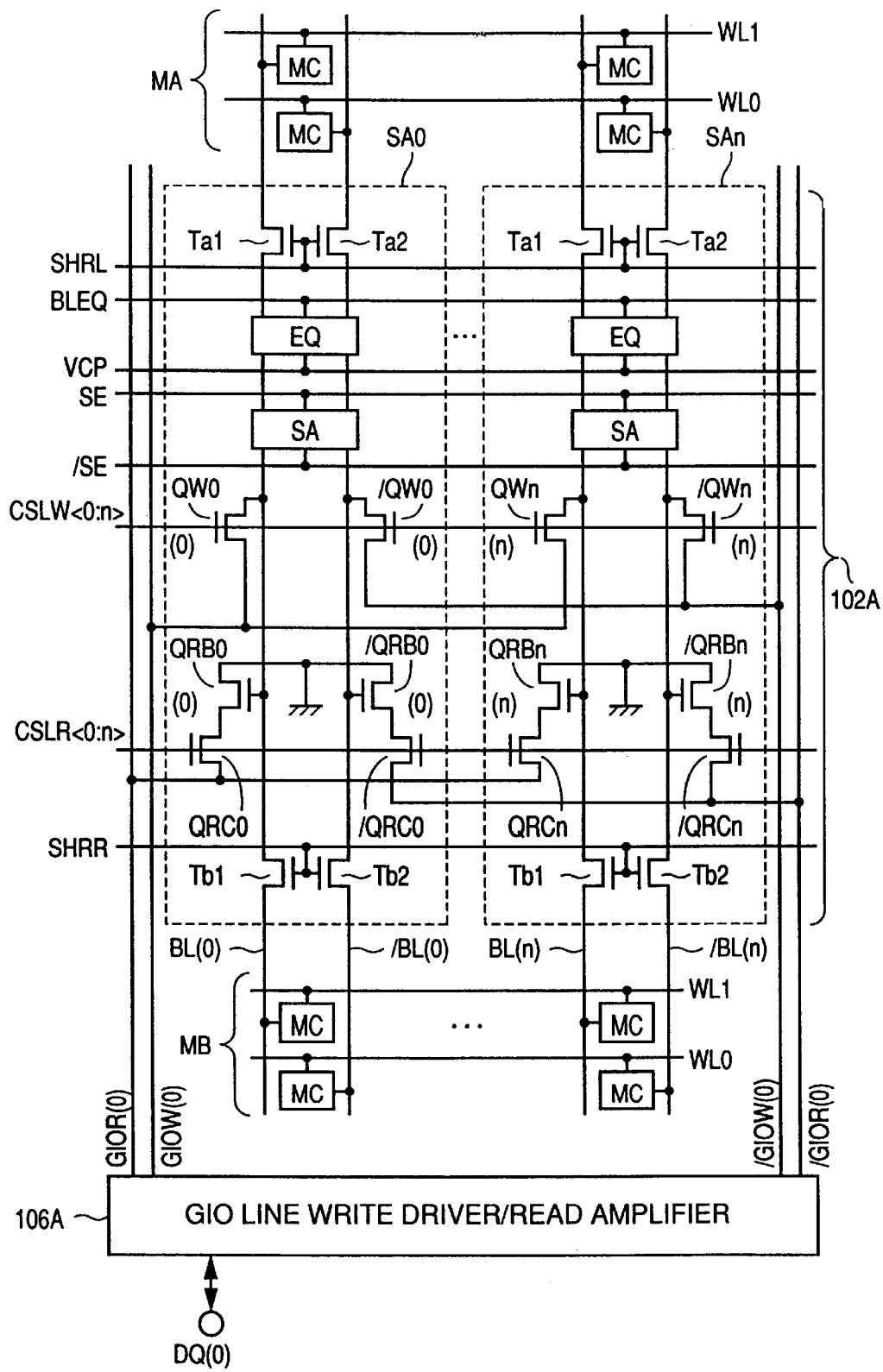
FIG. 1 illustrates the structure of a principal part of a semiconductor memory device 1000 according to a first embodiment of the present invention.

Embodiments of the present invention are now described in detail with reference to the drawings. Referring to the drawings, parts identical or corresponding to each other are denoted by the same reference numerals and redundant description is not repeated.

[First Embodiment]

The principal part of a semiconductor memory device 1000 according to a first embodiment of the present invention is now described. The semiconductor memory device 1000 comprises a plurality of pairs of write data lines GIOW and /GIOW for a write operation and a plurality of pairs of read data lines GIOR and /GIOR for a read operation. The pairs of write data lines GIOW and /GIOW and the pairs of read data lines GIOR and /GIOR are arranged in correspondence to data input/output terminals respectively.

FIG. 1 shows a pair of write data lines GIOW(0) and /GIOW(0) and a pair of read data lines GIOR(0) and /GIOR(0) arranged in correspondence to a data input/output terminal DQ(0).

Symbol MC denotes memory cells, symbols WL0 and WL1 denote word lines, and symbols BL(0), /BL(0), BL(n) and /BL(n) denote bit lines respectively. Symbol CSLW<0:n> denotes column selection signals CSLW(0) to CSLW(n) for the write operation, and symbol CSLR<0:n> denotes column selection lines CSLR(0) to CSLR(n) for the read operation respectively.

SA/input/output circuit blocks SA0, . . . , SAn provided in correspondence to the pairs of bit lines BL(0), /BL(0), BL(n) and /BL(n) include write gates receiving the column selection signals CSLW for the write operation and read gates receiving the column selection signals CSLR for the read operation as described later.

Figure 2:
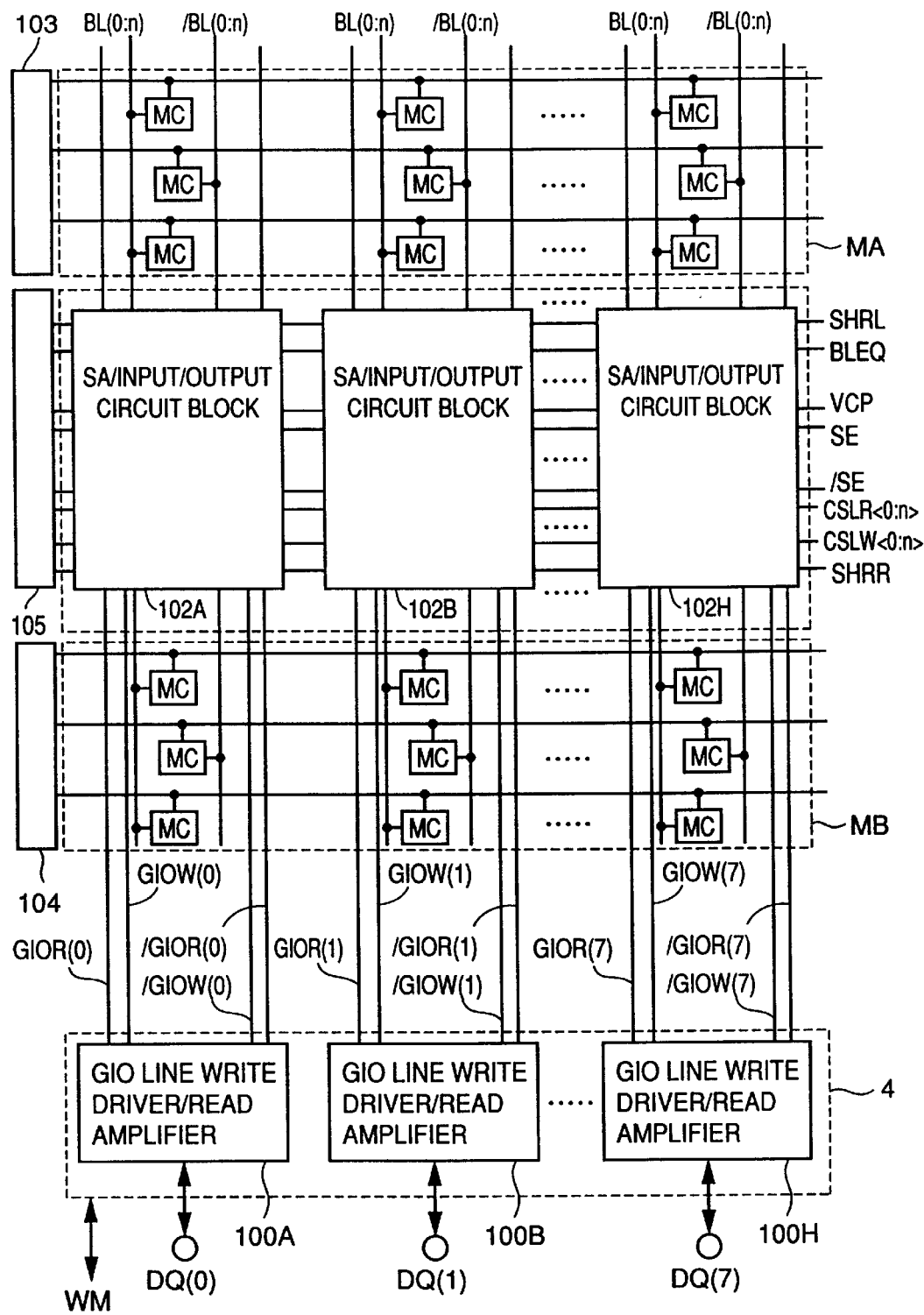
FIG. 2 illustrates the structures of pairs of write data lines and pairs of read data lines in the semiconductor memory device 1000 according to the first embodiment of the present invention.

As shown in FIG. 2, SA/input/output circuit blocks 102A to 102H, pairs of write data lines GIOW(0) and /GIOW(0), . . . , GIOW(7) and /GIOW(7), pairs of read data lines GIOR(0) and /GIOR(0), . . . , GIOR(7) and /GIOR(7) and GIO line write drivers/read amplifiers 100A to 100H are arranged for eight data input/output terminals DQ(0) to DQ(7) respectively. The SA/input/output circuit blocks 102A to 102H are identical in structure to each other, and the GIO line write drivers/read amplifiers 100A to 100H are also identical in structure to each other. Each of symbols BL(0:n) and /BL(0:n) denotes a plurality of bit lines.

A write mask signal WM is input when no data is rewritten in only a certain bit in the write operation. The 1-bit write mask signal WM controls the 8-bit write data lines GIOW(0) and /GIOW(0), . . . GIOW(7) and /GIOW(7).

In the semiconductor memory device 1000 having a shared sense amplifier structure, an S/A zone (sense amplifier block) including the SA/input/output circuit blocks 102A to 102H is arranged between memory cell arrays MA and MB.

Row decoders 103 and 104 shown in FIG. 2 output word line activation signals WL for selecting word lines of the memory cell arrays MA and MB respectively. In response to the word line activation signals WL, data are read on the bit lines from the memory cells MC or are written in the memory cells MC from the bit lines. A row decoder (SA)/column decoder 105 outputs signals (BLEQ, SHRL, SHRR, SE, /SE, CSLW<0:n> and CSLR<0:n>) controlling the S/A zone.

The SA/input/output circuit block 102A is described with reference to FIG. 1. The SA/input/output circuit block 102A includes a plurality of blocks SA0, . . . , SAn. Each of the plurality of blocks SA0, . . . , SAn includes a sense amplifier SA, an equalization circuit EQ and NMOS transistors Ta1, Ta2, Tb1 and Tb2. Each of the blocks SA0 to SAn are arranged in correspondence to each pair of bit lines. The blocks SA0 to SAn are identical in structure to each other.

A gate formed by the transistors Ta1 and Ta2 is turned on by the signal SHRL for connecting the SA/input/output circuit block 102A with the memory cell array MA. A gate formed by the transistors Tb1 and Tb2 is turned on by the signal SHRR for connecting the SA/input/output circuit block 102A with the memory cell array MB. These gates form a BL shared circuit. The two memory cell arrays MA and MB share the sense amplifier block by the BL shared circuit. The signal SHRL is turned on (high) and the signal SHRR is turned off (low) for accessing the memory cell array MA. The signal SHRR is turned on (high) and the signal SHRL is turned off (low) for accessing the memory cell array MB.

The equalization circuit EQ equalizes the pair of bit lines with the equalization signal BLEQ. The sense amplifier SA is activated by the sense amplifier activation signals SE and /SE. The sense amplifier SA includes a cross-coupled latch amplifying read data read from any memory cell and a circuit transferring write data to any bit line.

Each of the blocks SA0 to SAn further includes a write gate controlled by the column selection signal CSLW for the write operation and a read gate controlled by the column selection signal CSLR for the read operation.

A write gate including NMOS transistors QW0 and /QW0 and a read gate including NMOS transistors QRC0, /QRC0, QRB0 and /QRB0 are arranged in the block SA0, for example. The transistors QW0 and /QW0 receive the column selection signal CSLW(0) in the gates thereof while the transistors QRC0 and /QRC0 receive the column selection signal CSLR(0) in the gates thereof A write gate including NMOS transistors QWn and /QWn and a read gate including NMOS transistors QRCn, /QRCn, QRBn and /QRBn are arranged in the block SAn. The transistors QWn and /QWn receive the column selection signal CSLW(n) in the gates thereof while the transistors QRCn and /QRCn receive the column selection signal CSLR(n) in the gates thereof.

In the write operation, write data is transferred from a sense amplifier selected from n sense amplifiers to the bit line through the column selection signals CSLW(0) to CSLW(n). In the read operation, read data is transferred from a sense amplifier selected from the n sense amplifiers to the read data line through the column selection signals CSLR(0) to CSLR(n).

The following description is made with reference to the block SA0. The transistor QW0 is connected between the bit line BL(0) and the write data line GIOW(0), and the transistor /QW0 is connected between the bit line /BL(0) and the write data line /GIOW(0).

The transistor QRB0 is connected between a node receiving a ground voltage and a first conducting terminal of the transistor QRC0, with the gate connected to the bit line BL(0). The transistor /QRB0 is connected between the node receiving the ground voltage and a first conducting terminal of the transistor /QRC0, with the gate connected to the bit line /BL(0). A second conducting terminal of the transistor QRC0 is connected with the write data line GIOR(0), and a second conducting terminal of the transistor /QRC0 is connected with the write data line /GIOR(0).

The column selection signal CSLW is activated in the write operation on the basis of a column address signal. The column selection signal CSLR is activated in the read operation on the basis of the column address signal.

Figure 3:
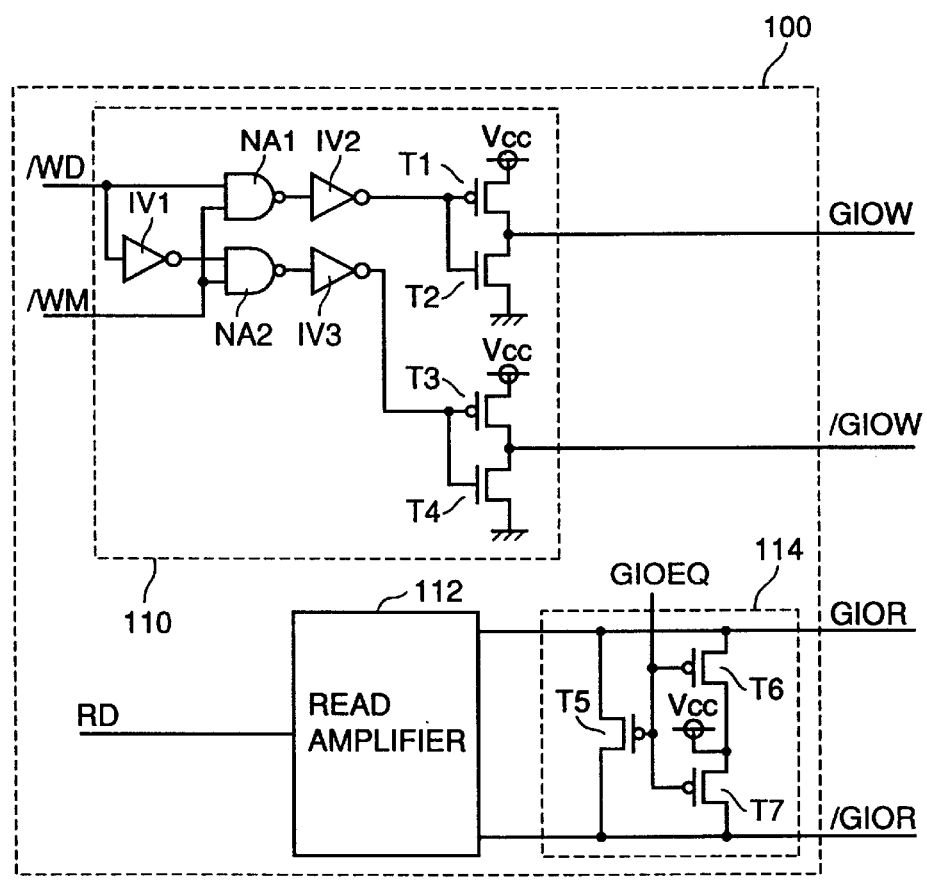
FIG. 3 illustrates an exemplary structure of a GIO line write driver/read amplifier according to the first embodiment of the present invention.

The structure of each GIO line write driver/read amplifier is now described with reference to FIG. 3. The GIO line write driver/read amplifier 100 shown in FIG. 3 includes a GIO line write driver 110 driving the pair of write data lines GIOW and /GIOW, a read amplifier 112 arranged for the pair of read data lines GIOR and /GIOR and a GIO line equalization circuit 114 for equalizing the pair of read data lines GIOR and /GIOR.

The GIO line write driver 110 includes inverters IV1 to IV3, NAND circuits NA1 and NA2, NMOS transistors T2 and T4 and PMOS transistors T1 and T3.

The NAND circuit NA1 receives write data /WD (inverted data of the write data WD) and a write mask signal /WM (inverted signal of the write mask signal WM) in the inputs thereof, and the NAND circuit NA2 receives an output of the inverter IV1 inverting the write data /WD and the write mask signal /WM in the inputs thereof. The inverter IV2 inverts the output of the NAND circuit NA1 and the inverter IV3 inverts the output of the NAND circuit NA2.

The transistors T1 and T2 are connected between a node receiving a power supply voltage Vcc and a node receiving the ground voltage. The transistors T3 and T4 are connected between a node receiving the power supply voltage Vcc and a node receiving the ground voltage. The gates of the transistors T1 and T2 receive the output of the inverter IV2, and the gates of the transistors T3 and T4 receive the output of the inverter IV3. The write data line GIOW is connected with the node between the transistors T1 and T2, and the write data line /GIOW is connected with the node between the transistors T3 and T4.

The GIO line equalization circuit 114 includes PMOS transistors T5, T6 and T7 receiving a signal GIOEQ controlling equalization in the gates thereof The transistor T5 is connected between the read data lines GIOR and /GIOR. The transistor T6 is connected between the read data line GIOR and a node receiving the power supply voltage Vcc, and the transistor T7 is connected between the node receiving the power supply voltage Vcc and the read data line /GIOR. The pair of read data lines GIOR and /GIOR are equalized in response to the signal GIOEQ. No equalization circuit is arranged for the write data lines GIOW and /GIOW.

The read amplifier 112 amplifies data of the pair of read data lines GIOR and /GIOR and outputs read data RD.

In the read operation, data of a memory cell connected to a selected word line is output to a pair of bit lines. The sense amplifier SA differentially amplifies the data of the pair of bit lines. The read gate (QRC0, /QRC0, . . . , QRCn, /QRCn) is turned on in response to the column selection signal CSLR. Thus, the potentials of the pair of read data lines GIOR and /GIOR change.

In the write operation, the GIO line write driver 110 drives the pair of write data lines GIOW and /GIOW. The write gate (QW0, /QW0 . . . , QWn, /QWn) is turned on in response to the column selection signal CSL. Thus, write data is written in a memory cell connected to a selected word line.

The pair of write data lines GIOW and /GIOW are not equalized. Only the pair of read data lines GIOR and /GIOR are equalized for preventing false reading.

The write mask signal /WM is set low only when performing write masking. Thus, the pair of write data lines GIOW and /GIOW are precharged (high).

Figure 4:
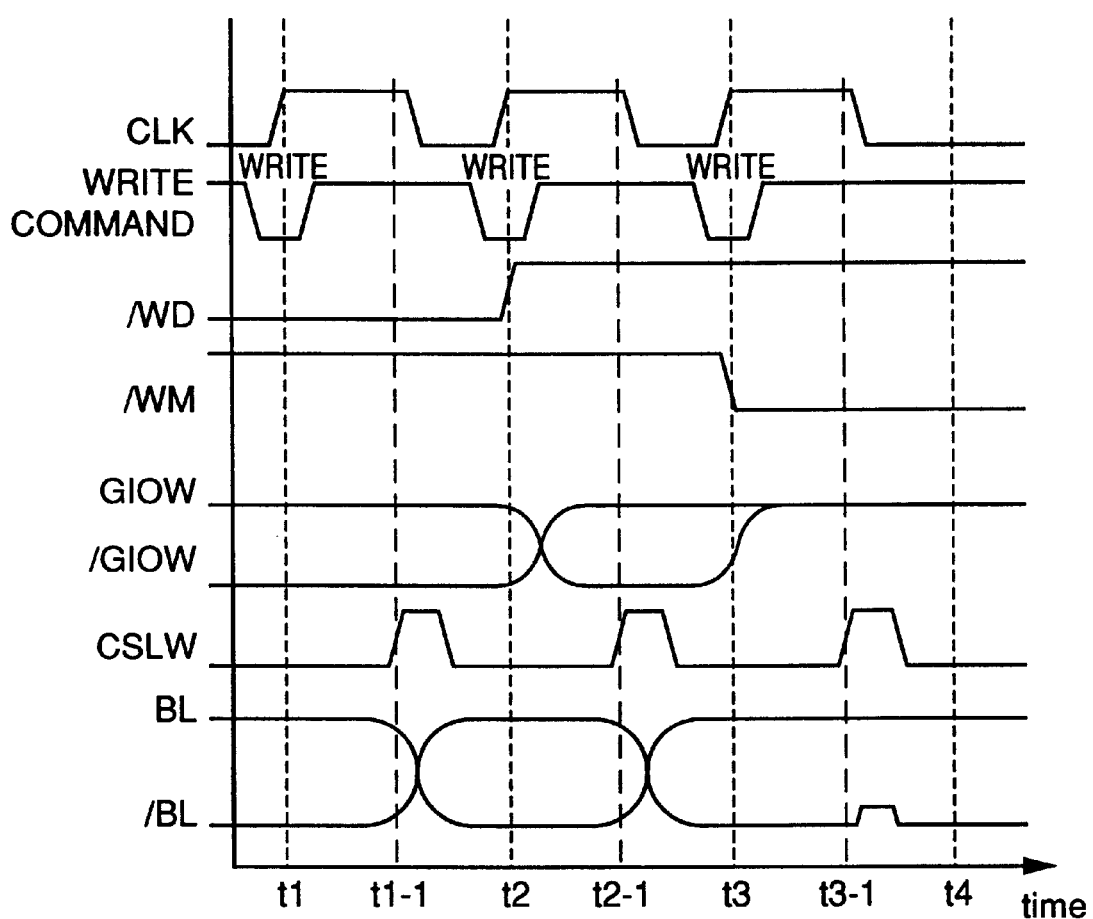
FIG. 4 is a timing chart for illustrating operations of the semiconductor memory device 1000 according to the first embodiment of the present invention.

Operations of the semiconductor memory device 1000 according to the first embodiment of the present invention are now described with reference to FIG. 4. When a write command specifying the write operation is input in synchronization with a clock CLK, the device enters a write operation mode. The write data /WD is set low.

If the write data /WD remains unchanged at a time t1, the pair of write data lines GIOW and /GIOW remain unchanged. The column selection signal CSLW is set high at a time t1–1, and the write gate is turned on. Thus, the potentials of the selected pair of bit lines BL and /BL are inverted in response to the potentials of the pair of write data lines GIOW and /GIOW, and the write data /WD is stored in the memory cell connected to the selected word line.

At a time t2, the write data /WD goes high and the potentials of the pair of write data lines GIOW and /GIOW are inverted. At a time t2–1, the column selection signal CSLW is set high for turning on the write gate. Thus, the potentials of the selected pair of bit lines BL and /BL change in response to the potentials of the pair of write data lines GIOW and /GIOW. The write data /WD is stored in the memory cell connected to the selected word line.

At a time t3, the write mask signal /WM is activated low for precharging the pair of write data lines GIOW and /GIOW high. While the column selection signal CSLW goes high at a time t3−1, the potentials of the selected pair of bit lines BL and /BL are not inverted since the pair of write data lines GIOW and /GIOW are precharged high. Thus, no data is written in the bit not to be subjected to writing.

Figure 5:
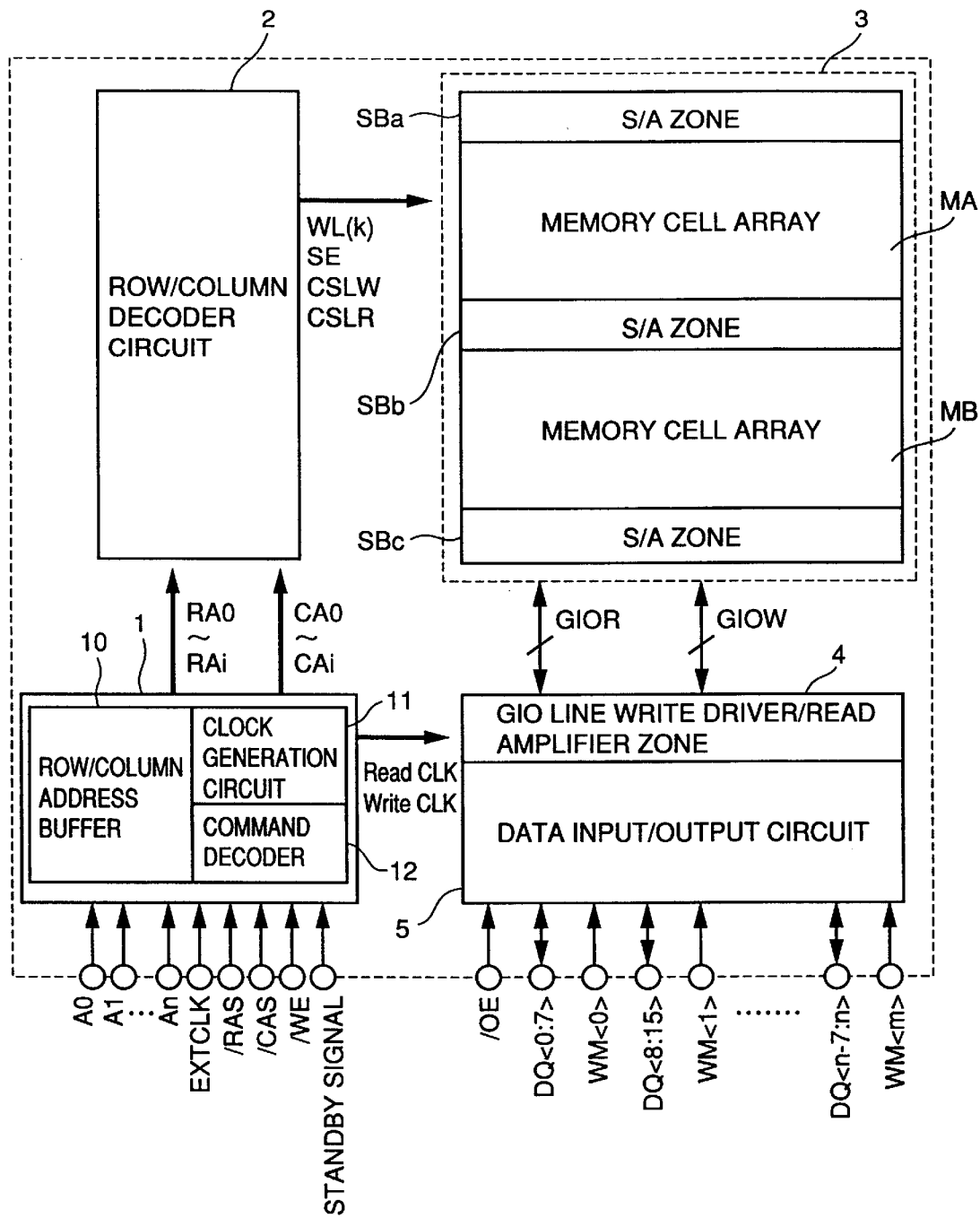
FIG. 5 is a block diagram showing an outline of the overall structure of the semiconductor memory device 1000 according to the first embodiment of the present invention.

FIG. 5 shows an outline of the overall structure of the semiconductor memory device 1000 according to the first embodiment of the present invention. The semiconductor memory device 1000, which is a synchronous semiconductor memory device, comprises a block 1 including a row/column address buffer 10 capturing address signals A0, A1, . . . , An, a clock generation circuit 11 receiving an external clock EXTCLK and generating clocks deciding the timing of internal operations and a command decoder 12 generating internal control signals in response to external control signals, as shown in FIG. 5.

The row/column address buffer 10 predecodes row-system address signals to output row address signals RA0 to RAi, and predecodes column-system address signals to output column address signals CA0 to CAi.

The clock generation circuit 11 generates the internal clock CLK, a write clock WriteCLK for the write operation and a read clock ReadCLK for the read operation, for example. The command decoder 12 receives a row address strobe signal /RAS, a column address strobe signal /CAS, a write enable signal /WE, a standby signal for bringing the device 1000 into a standby mode and the like. The block 1 controls a burst operation for continuously inputting/outputting data.

The semiconductor memory device 1000 further comprises a row/column decoder circuit 2 decoding the row address signals RA0 to RAi and the column address signals CA0 to CAi and a memory part 3 including the memory cell arrays MA and MB each including a plurality of memory cells arranged in rows and columns, word lines corresponding to the rows and bit lines corresponding to the columns and S/A zones SBa, SBb and SBc arranged to hold the memory cell arrays MA and MB therebetween.

The row/column decoder circuit 2 includes a row decoder decoding the row address signals RA0 to RAi and outputting the word line activation signal WL(K) and the sense amplifier activation signal SE and a column decoder decoding the column address signals CA0 to CAi and outputting the column selection signals CSLW and CSLR performing selection in the column direction. The aforementioned row decoders 103 and 104 and row decoder (SA)/column decoder 105 are included in the row/column decoder circuit 2. The aforementioned SA/input/output circuit blocks SA . . . , SAn are included in the S/A zones SBa, SBb and SBc.

The semiconductor memory device 1000 further comprises a GIO line write driver/read amplifier zone 4 including GIO write drivers for transferring externally received data to the write data lines GIOW and /GIOW and read amplifiers for amplifying read data received from the memory cell arrays MA and MB through the read data lines GIOR and /GIOR and a data input/output circuit 5 for controlling the GIO line write driver/read amplifier zone 4 and outputting the read data or inputting externally input write data in the write drivers.

The GIO line write driver/read amplifier zone 4 includes the aforementioned GIO line write drivers/read amplifiers 100A, 100B, . . . , the structure of which has been described with reference to FIG. 3.

The data input/output circuit 5 transmits/receives signals to/from a terminal /OE receiving an output enable signal /OE, data input/output terminals for inputting/outputting input/output data DQ<0:7>, DQ<8:15>, . . . , DQ<n−7:n> and terminals WM receiving write mask signals WM(0), WM(1), . . . , WM(m). Hundreds of such data input/output terminals are arranged on a system LSI having a memory part and a logic part in combination. Thus, the data transfer rate between the data input/output circuit 5 and a logic circuit (not shown) provided on the same substrate is improved.

The memory part 3 and the GIO line write driver/read amplifier zone 4 transfer data through the pairs of read data lines (denoted by symbol GIOR in FIG. 5) and the pairs of write data lines (denoted by symbol GIOW in FIG. 5).

Thus, based on the structure according to the first embodiment of the present invention, the pairs of write data lines GIOW and /GIOW and the pairs of read data lines GIOR and /GIOR are so separated from each other that the pairs of write data lines GIOW and /GIOW may not be precharged high after writing. Thus, a high-speed operation is enabled. Further, the write data lines GIOW and /GIOW can be precharged only in write masking, so that no write data is written in a certain bit.

[Second Embodiment]

A second embodiment of the present invention relates to a structure for settling a write mask signal WM at a high speed. A semiconductor memory device according to the second embodiment of the present invention includes a write mask settling circuit 200 shown FIG. 6 in addition to the structure according to the first embodiment.

Figure 6:
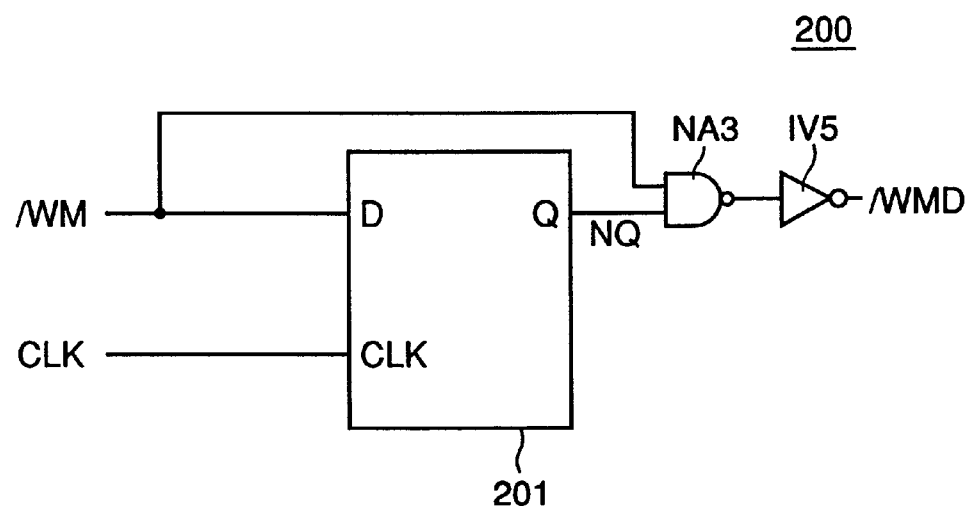
FIG. 6 is a circuit diagram showing a write mask settling circuit 200 included in a semiconductor memory device according to a second embodiment of the present invention.

As shown in FIG. 6, the write mask settling circuit 200 includes an inverter IV5, a NAND circuit NA3 and a latch circuit 201. The latch circuit 201 latches a write mask signal /WM received in a terminal D in response to an internal clock CLK. The NAND circuit NA3 receives the write mask signal /WM and a signal NQ output from a terminal Q of the latch circuit 201. The inverter IV5 inverts the output of the NAND circuit NA3 and outputs a write mask signal /WMD.

The write mask settling circuit 200 is so structured as to asynchronously capture a signal corresponding to the write mask signal WM input from an external terminal and latch this signal with the internal clock CLK. For example, the write mask signal /WMD is supplied to the GIO line write driver 110 according to the first embodiment.

In a general write operation, no malfunction takes place also when a column selection signal CSLW is set high halfway the amplitude of a pair of write data lines GIOW and /GIOW. In write masking, however, the potentials of bit lines may be inverted unless the column selection signal CSLW is set high after completely precharging the pair of write data lines GIOW and /GIOW high.

Therefore, the write mask settling circuit 200 settles the write mask signal /WM in advance of write data for completely precharging the write data lines GIOW and /GIOW high in an early stage.

Figure 7:
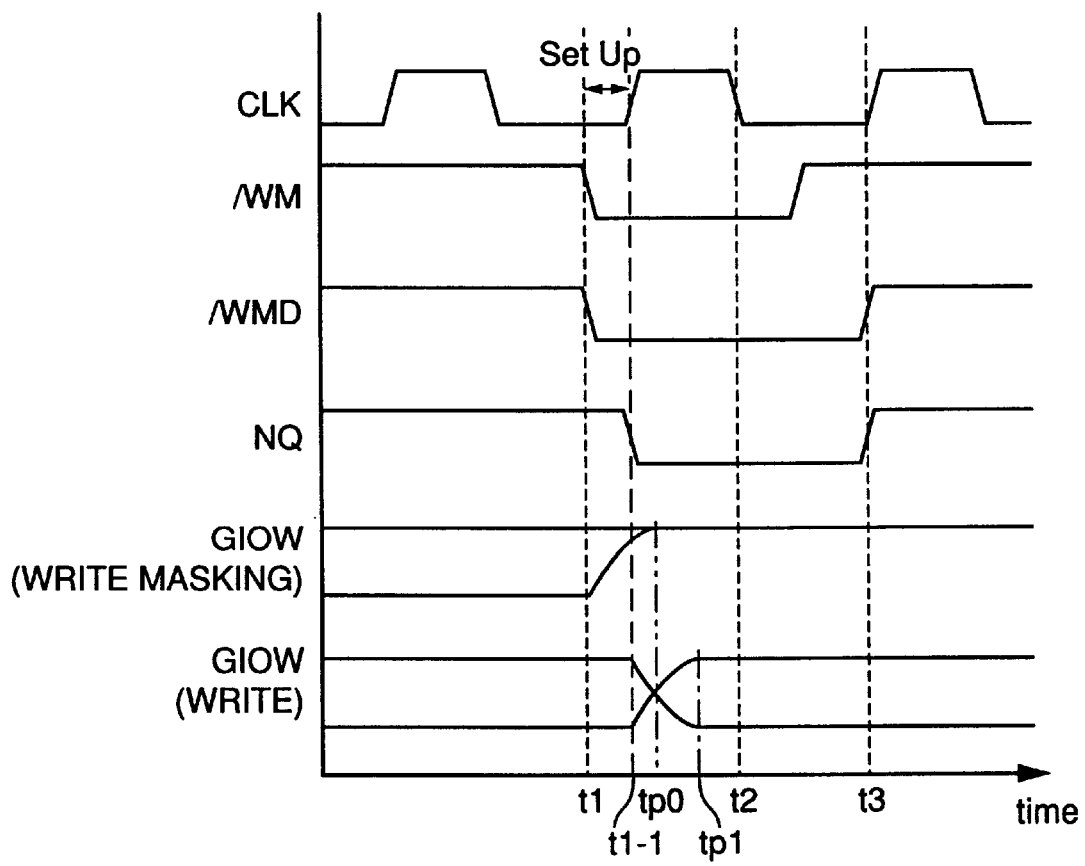
FIG. 7 is a timing chart for illustrating operations based on the structure of the second embodiment of the present invention.

Operations based on the structure of the second embodiment of the present invention are now described with reference to FIG. 7. According to definition of an external input terminal, input data must be settled in a prescribed setup period. Therefore, the write mask signal /WM is input at a time t1 starting the setup period and asynchronously settled with the NAND circuit NA3.

In write masking, the pair of write data lines GIOW and /GIOW are precharged high in the setup period (denoted by symbol Set Up in FIG. 7) between the time t1 and a time t1−1 when the internal clock CLK rises, and the potentials thereof are settled at a time tp0.

A signal NQ is settled at the time t1−1. The write mask signal /WM is latched at a time t2 when the internal clock CLK falls. The value of the signal NQ is held up to a time t3 when a next internal clock CLK rises. Next data is captured at the time t3.

In a general write operation, the potentials of the pair of write data lines GIOW and /GIOW start to change at the time t1−1 in accordance with write data, and are settled at a time tp1.

The write mask signal /WM can be most quickly input in the GIO line write driver 110 due to the aforementioned operations. Consequently, the precharge time for the pair of write data lines GIOW and /GIOW is quickened by (tp1−tp0). Therefore, a malfunction resulting from insufficient precharging (half-finished precharging) can be prevented.

[Third Embodiment]

In a third embodiment of the present invention, the precharge operation for the pair of write data lines GIOW and /GIOW according to the first embodiment is applied to a method of selecting a column.

Figure 8:
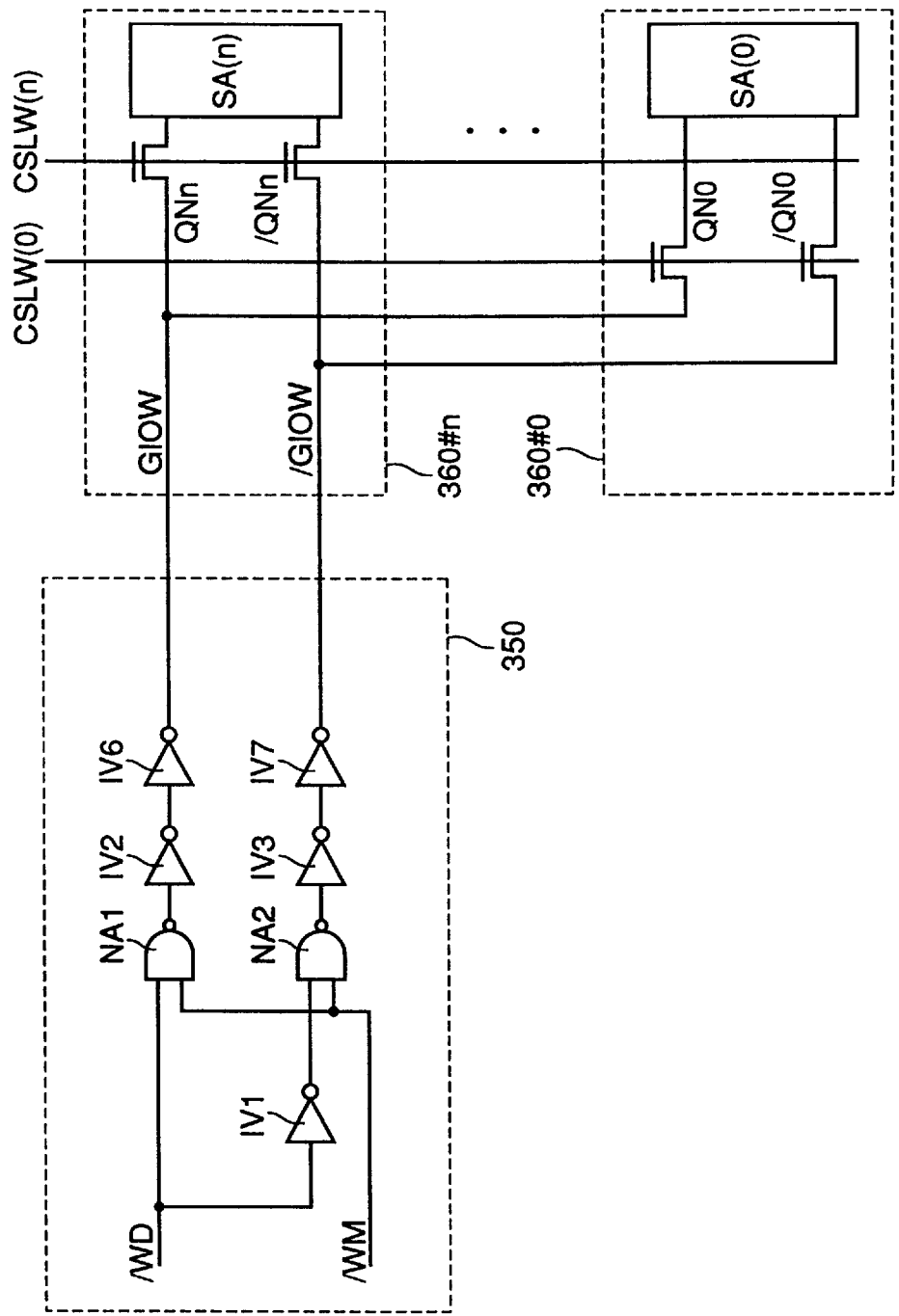
FIG. 8 is a diagram for illustrating a GIO line write driver 350 and SA/write gates.

For the purpose of comparison, a GIO line write driver 350 employing the structure according to the first embodiment and SA/write gates 360#0 to 360#n are described. FIG. 8 shows the relation between the GIO write driver 350 and the SA/write gates 360#0 to 360#n corresponding to a pair of write data lines GIOW and /GIOW.

The GIO line write driver 350 includes inverters IV1 to IV3, IV6 and IV7 and NAND circuits NA1 and NA2. The NAND circuit NA1 receives write data /WD and a write mask signal /WM in the inputs thereof, and the NAND gate NA2 receives the output of the inverter IV1 inverting the write data /WD and the write mask signal /WM in the inputs thereof. The inverter IV2 inverts the output of the NAND circuit NA1, and the inverter IV3 inverts the output of the NAND circuit NA2. The inverter IV6 inverts the output of the inverter IV2, and the inverter IV7 inverts the output of the inverter IV3. The write data line GIOW is connected with the output of the inverter IV6, and the write data line /GIOW is connected with the output of the inverter IV7.

The SA/write gates 360#0 to 360#n include sense amplifiers SA(0) to SA(n) and NMOS transistors QN0 and /QN0, . . . , QNn and /QNn.

The transistors QN0 and /QN0, . . . , QNn and /QNn form write gates respectively. The transistors QN0 to QNn are connected between the write data line GIOW and the sense amplifiers SA(0) to SA(n). The transistors /QN0 to /QNn are connected between the write data line /GIOW and the sense amplifiers SA(0) to SA(n).

Write gates are rendered conductive in response to column selection signals CSLW. For example, the transistors QN0 and /QN0 are rendered conductive in response to a column selection signal CSLW(0), and the transistors QNn and /QNn are rendered conductive in response to a column selection signal CSLW(n).

Figure 9:
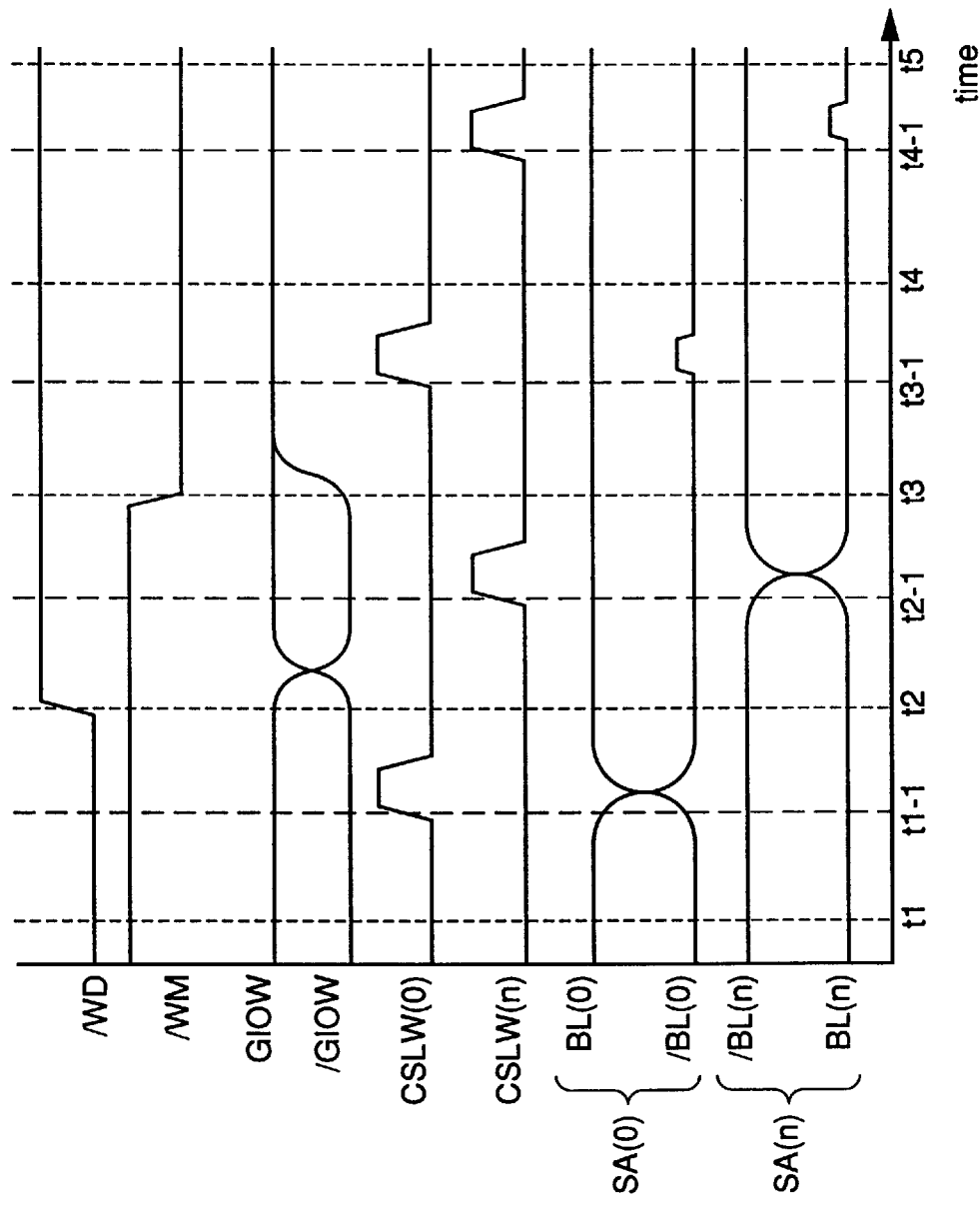
FIG. 9 is a timing chart for illustrating operations based on the circuits shown in FIG. 8.

Circuit operations shown in FIG. 8 are described with reference to FIG. 9. The column selection signal CSLW(0) is set high at a time t1−1, and the potentials of a pair of bit lines BL and /BL change in response to the output of the sense amplifier SA(0). Data is written in a selected memory cell.

The write data /WD goes high at a time t2, and the potentials of the pair of write data lines GIOW and /GIOW change. The column selection signal CSLW(n) is set high at a time t2−1, and the potentials of a pair of bit lines BL(n) and /BL(n) change in response to the sense amplifier SA(n). Data is written in a selected memory cell.

The write mask signal /WM is set low at a time t3, for starting write masking. The pair of write data lines GIOW and /GIOW are precharged high. Therefore, the potentials of the pairs of bit lines BL and /BL remain unchanged also when the column selection signals CSLW(0) to CSLW(n) are set high. In other words, no data are rewritten.

According to this structure, however, signal lines for supplying the column selection signals CSLW are required by the number of the sense amplifiers SA (the number of the pairs of bit lines BL and /BL).

According to the third embodiment of the present invention, a single column selection signal is assigned to two pairs of (even and odd) write data lines. In a write operation, either pair of write data lines are precharged while performing the write operation with the remaining pair of write data lines.

Figure 10:
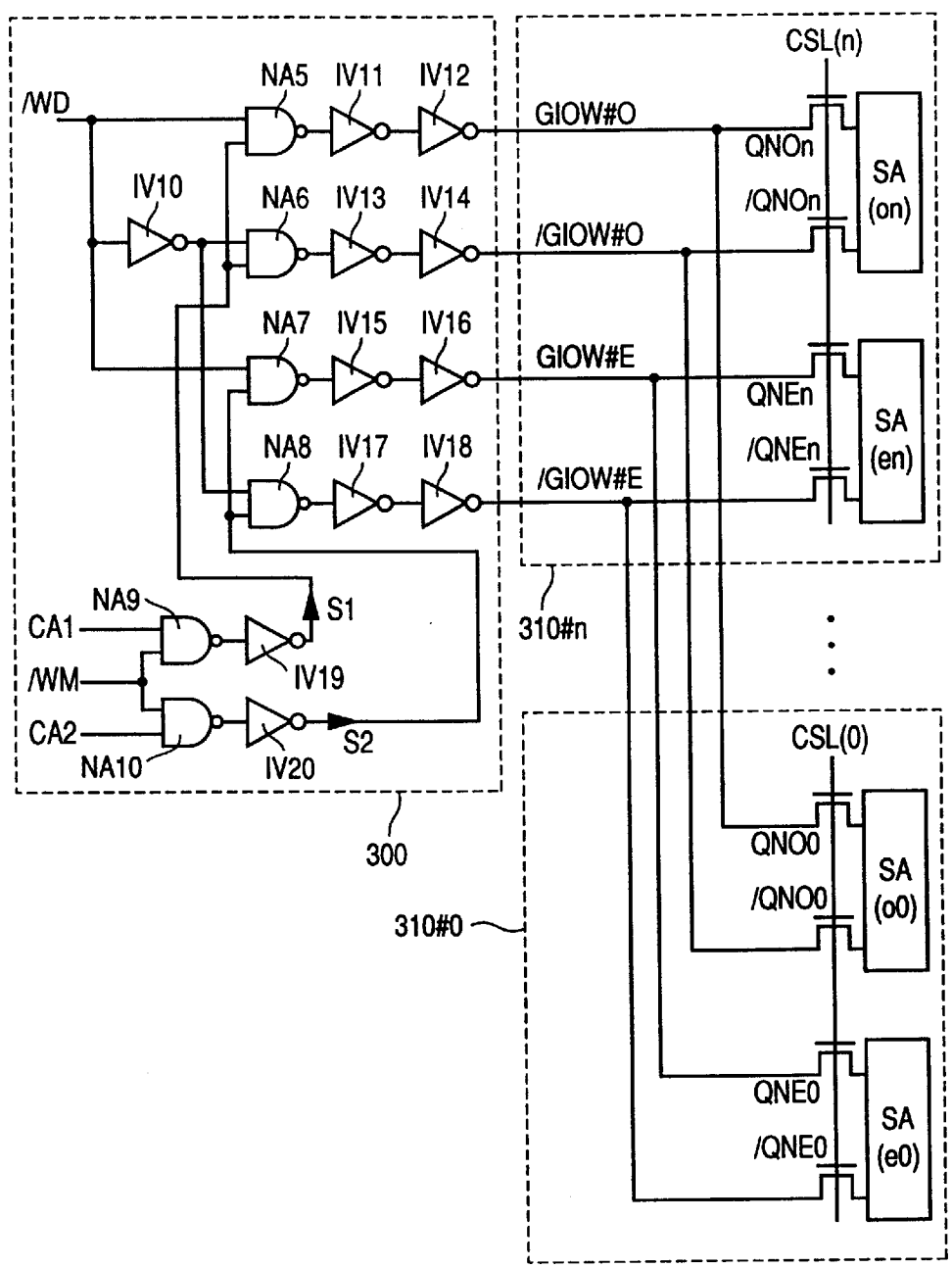
FIG. 10 is a diagram for illustrating a GIO line write driver and SA/write gates according to a third embodiment of the present invention.
Figure 11:
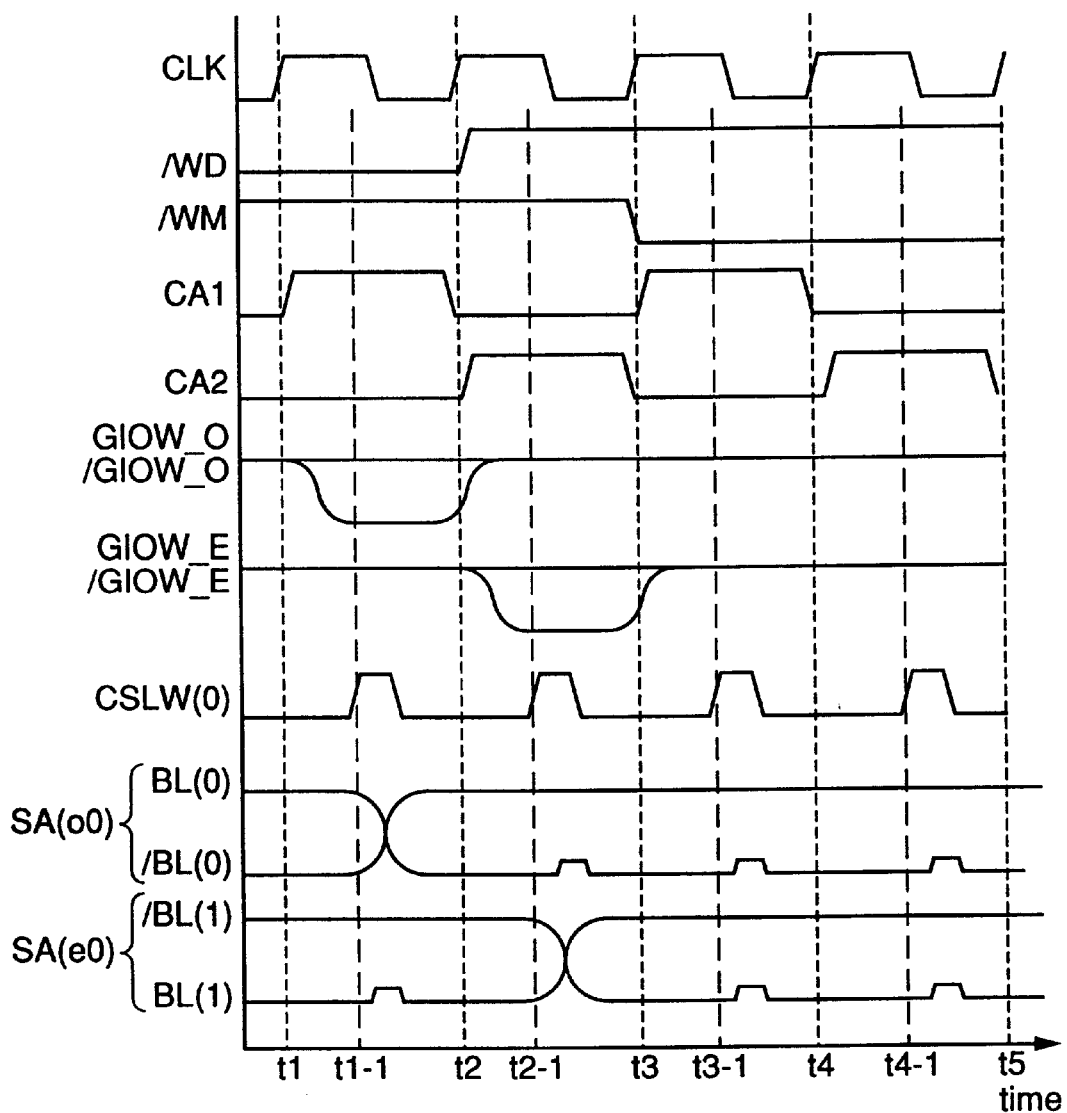
FIG. 11 is a timing chart for illustrating circuit operations according to the third embodiment of the present invention.

A GIO line write driver 300 and SA/write gates 310#0 to 310#n according to the third embodiment are now described with reference to FIGS. 10 and 11. FIG. 10 shows the relation between the GIO line write driver 300 and the SA/write gates 310#0 to 310#n corresponding to a pair of write data lines GIOW#O and /GIOW#O and a pair of write data lines GIOW#E and /GIOW#E.

The SA/write gates 310#0 to 310#n include sense amplifiers SA(o0) to SA(on) and SA(e0) to SA(en) and NMOS transistors QNO0 and /QNO0, . . . , QNOn and /QNOn and QNE0 and /QNE0, . . . , QNEn and /QNEn.

The transistors QNO0 to QNOn are connected between the write data line GIOW#O and the sense amplifiers SA(o0) to SA(on). The transistors /QNO0 to /QNOn are connected between the write data line /GIOW#O and the sense amplifiers SA(o0) to SA(on).

The transistors QNE0 to QNEn are connected between the write data line GIOW#E and the sense amplifiers SA(e0) to SA(en). The transistors /QNE0 to /QNEn are connected between the write data line /GIOW#E and the sense amplifiers SA(e0) to SA(en).

The transistors QNO0 and /QNO0, . . . , QNOn and /QNOn and QNE0 and /QNE0, . . . , QNEn and /QNEn form write gates respectively.

The same column selection signal is supplied to two write gates (four transistors). For example, the transistors QNO0, /QNO0, QNE0 and /QNE0 receive a column selection signal CSLW(0) in the gates thereof, and the transistors QNOn, /QNOn, QNEn and /QNEn receive a column selection signal CSLW(n) in the gates thereof.

The GIO line write driver 300 includes inverters IV10 to IV20 and NAND circuits NA5 to NA10. The NAND circuit NA5 receives write data /WD and a selection signal Si in the inputs thereof, and the NAND circuit NA6 receives the output of the inverter IV10 inverting the write data /WD and the selection signal S1 in the inputs thereof. The NAND circuit NA7 receives the write data /WD and a selection signal S2 in the inputs thereof, and the NAND circuit NA8 receives the output of the inverter IV10 and the selection signal S2 in the inputs thereof.

The inverter IV11 inverts the output of the NAND circuit NA5, and the inverter IV12 inverts the output of the inverter IV11. The inverter IV13 inverts the output of the NAND circuit NA6, and the inverter IV14 inverts the output of the inverter IV13. The inverter IV15 inverts the output of the NAND circuit NA7, and the inverter IV16 inverts the output of the inverter IV15. The inverter IV17 inverts the output of the NAND circuit NA8, and the inverter IV18 inverts the output of the inverter IV17.

Output nodes of the inverters IV12, IV14, IV16 and IV18 are connected with the write data lines GIOW#O, /GIOW#O, GIOW#E and /GIOW#E respectively.

The NAND circuit NA9 receives a column address signal CA1 output from a row/column address buffer 10 and a write mask signal /WM in the inputs thereof, and the NAND circuit NA10 receives a column address signal CA2 and the write mask signal /WM in the inputs thereof. The inverter IV19 inverts the output of the NAND circuit NA9 and outputs the selection signal S1. The inverter IV20 inverts the output of the NAND circuit NA10 and outputs the selection signal S2.

When the write mask signal /WM is low, the selection signals S1 and S2 go low. Therefore, all outputs from the inverters IV12 to IV18 go high.

When the write mask signal /WM is high, one of the selection signals S1 and S2 goes high and the other one goes low in response to the column address signal CA1 or CA2. Data of the pair of write data lines GIOW#O and /GIOW#O are input in the sense amplifiers when the selection signal S1 goes high, while data of the pair of write data lines GIOW#E and /GIOW#E are input in the sense amplifiers when the selection signal S2 goes high.

Circuit operations according to the third embodiment of the present invention are described with reference to FIG. 11. The write mask signal /WM is set high. The column address signal CA1 is set high at a time t1, and the selection signal S1 goes high. The potentials of the pair of write data lines GIOW#O and /GIOW#O change in correspondence to the write data /WD. At this time, the selection signal S2 is low and hence the pair of write data lines GIOW#E and /GIOW#E are precharged high.

The column selection signal CSLW(0) is set high at a time t1−1, for selecting the sense amplifiers SA(o0) and SA(e0). The potentials of a pair of bit lines BL(0) and /BL(0) connected with the sense amplifier SA(o0) change. No data is written on the sense amplifier SA(e0) side.

Similarly, the column address signal CA2 is high at a time t2, and the selection signal S2 goes high. The potentials of the pair of write data lines GIOW#E and /GIOW#E change in correspondence to the write data /WD. At this time, the selection signal S1 is low and hence the pair of write data lines GIOW#O and /GIOW#O are precharged high.

The column selection signal CSLW(0) is set high at a time t2−1, for selecting the sense amplifiers SA(e0) and SA(o0). The potentials of a pair of bit lines BL(1) and /BL(1) connected with the sense amplifier SA(e0) change. No data is written on the sense amplifier SA(o0) side.

The write mask signal /WM is set low at a time t3, and the selection signals S1 and S2 go low. Both of the pair of write data lines GIOW#O and /GIOW#O and the pair of write data lines GIOW#E and /GIOW#E are precharged high. Therefore, no data is written also when the CSLW(0) is set high later (times t3−1 and t4−1).

Figure 12:
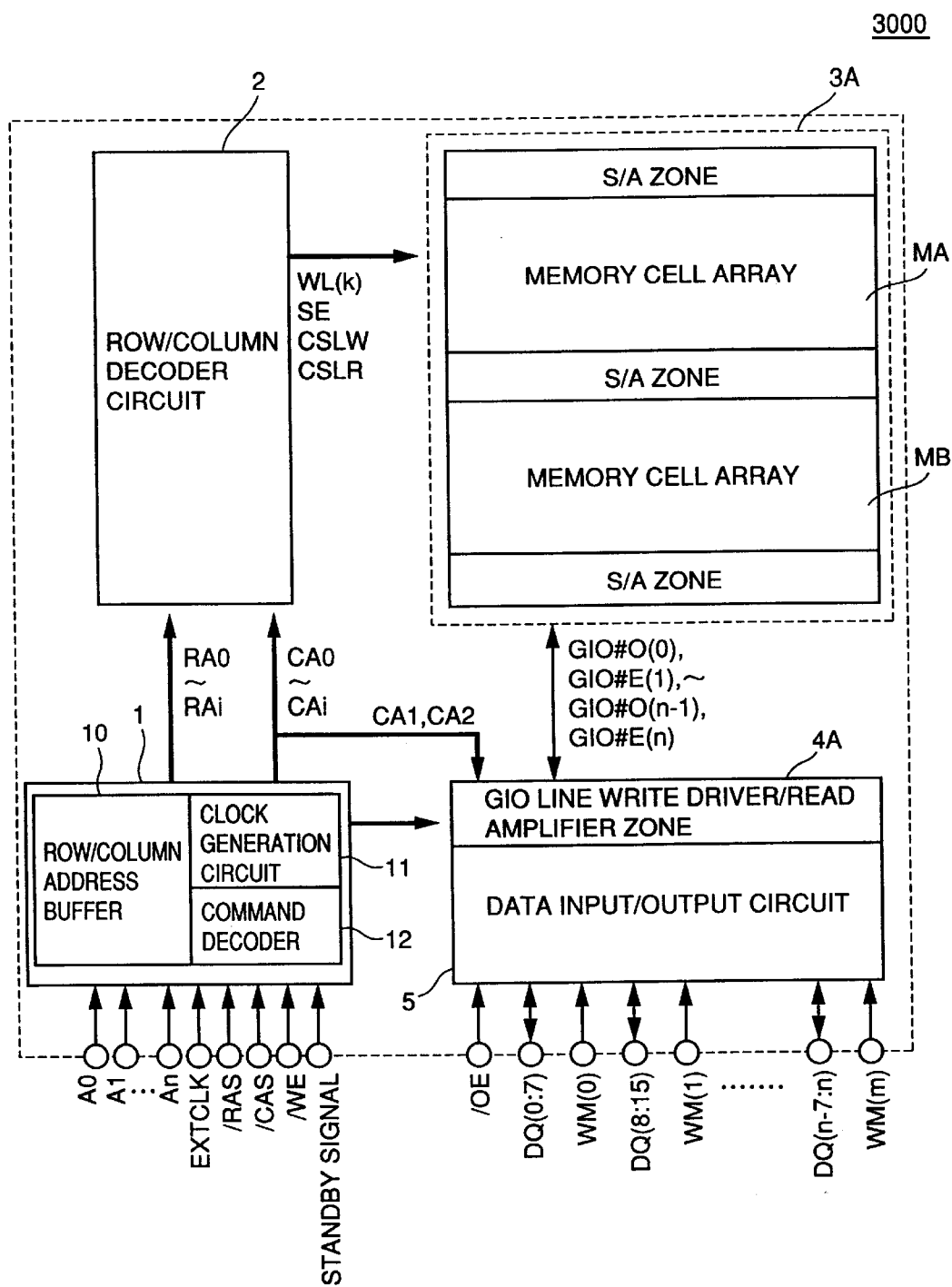
FIG. 12 is a block diagram showing an outline of the overall structure of a semiconductor memory device 3000 according to the third embodiment of the present invention.

A semiconductor memory device 3000 according to the third embodiment of the present invention has a structure shown in FIG. 12. As shown in FIG. 12, the semiconductor memory device 3000 comprises a block 1 including a row/column address buffer 10, a clock generation circuit 11 and a command decoder 12, a row/column decoder circuit 2, a memory part 3A including S/A zones having the SA/write gates 310#0 to 310#n, a GIO line write driver/read amplifier zone 4A including the GIO line write driver 300, and a data input/output circuit 5.

The aforementioned pairs of write data lines and pairs of read data lines are arranged between the memory part 3A and the GIO line write driver/read amplifier zone 4A, as denoted by symbols GIO#O(0), GIO#E(1), GIO#O(n−1) and GIO#O(n).

Thus, based on the structure according to the third embodiment of the present invention, a single column selection signal can be assigned in correspondence to two pairs of write data lines. Therefore, the number of signal lines transferring the column selection signals CSLW is so halved that the layout area can be reduced.

[Fourth Embodiment]

A fourth embodiment of the present invention relates to an exemplary improvement of the structure according to the first embodiment of the present invention. As described above, a system LSI having a logic circuit and a memory core on a single chip can simultaneously input/output hundreds of data and process the data at a high speed.

However, large loads are applied to the write data lines GIOW, and large current is consumed due to operations in correspondence to the number of the data. Further, large-sized inverters are required for driving the write data lines GIOW at a high speed due to the large loads. Therefore, subthreshold currents in the inverters are also increased.

Transistors used in a CMOS complementary metal-oxide semiconductor device include PMOS and NMOS transistors. In general, subthreshold current is increased in the PMOS transistors.

Figure 13:
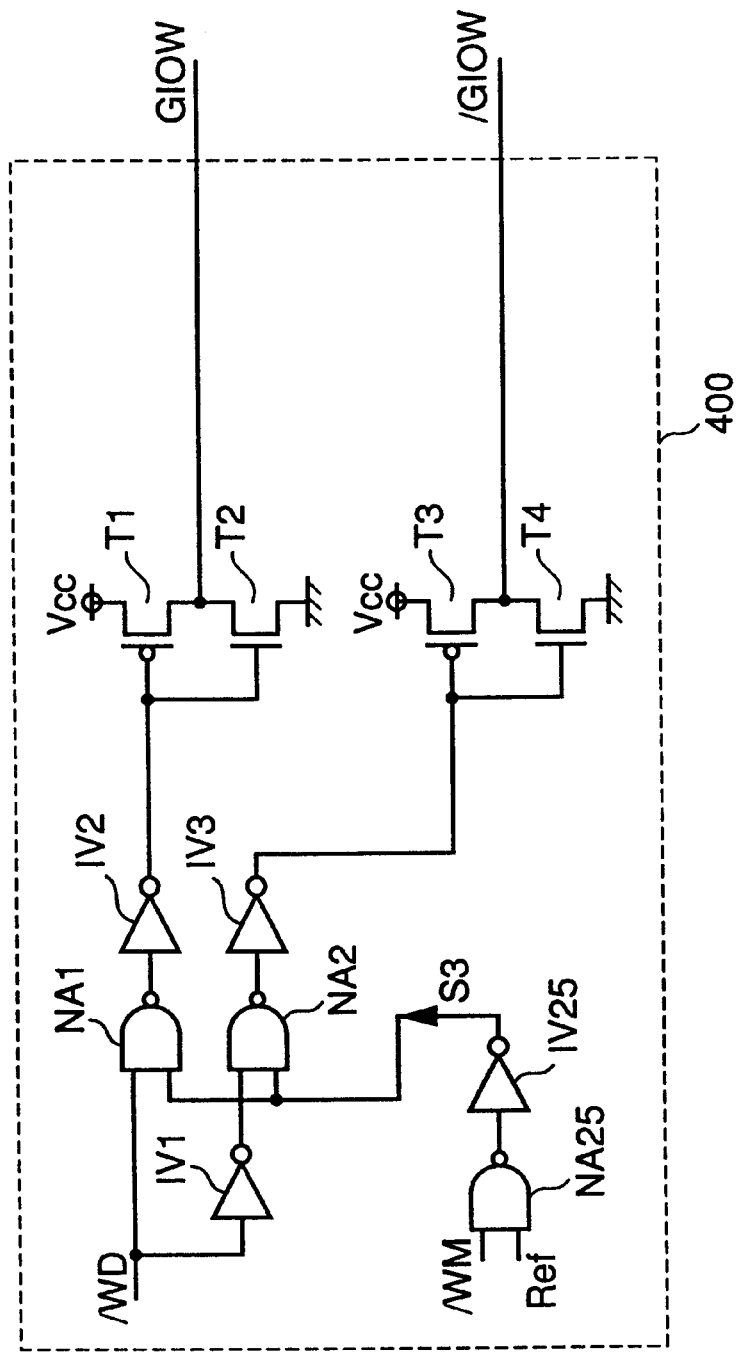
FIG. 13 is a circuit diagram showing an exemplary structure of a GIO line write driver 400 according to a fourth embodiment of the present invention.

In the fourth embodiment of the present invention, therefore, a GIO line write driver 400 shown in FIG. 13 is arranged in place of the GIO line write driver 110 according to the first embodiment, for suppressing occurrence of subthreshold current in PMOS transistors and reducing the subthreshold current.

The GIO line write driver 110 precharges the pair of write data lines GIOW and /GIOW high in write masking. The GIO line write driver 400 according to the fourth embodiment precharges a pair of write data lines GIOW and /GIOW high not only in write masking but also at desired timing. The GIO line write driver 400 includes inverters IV1 to IV3 and IV25, NAND circuits NA1, NA2 and NA25 and transistors T1 to T4. The connection between the inverters IV1 to IV3 and the transistors T1 to T4 is identical to that in the GIO line write driver 110.

The NAND circuits NA1 and NA2 receive a signal S3 output from the inverter IV25 in the inputs thereof in place of a write mask signal /WM. The inverter IV25 inverts the output of the NAND circuit NA25 and outputs the signal S3. The NAND circuit NA25 receives the write mask signal /WM and a control command signal Ref in the inputs thereof.

When at least either the write mask signal /WM or the control command signal Ref goes low, the pair of write data lines GIOW and /GIOW are precharged high.

Figure 14:
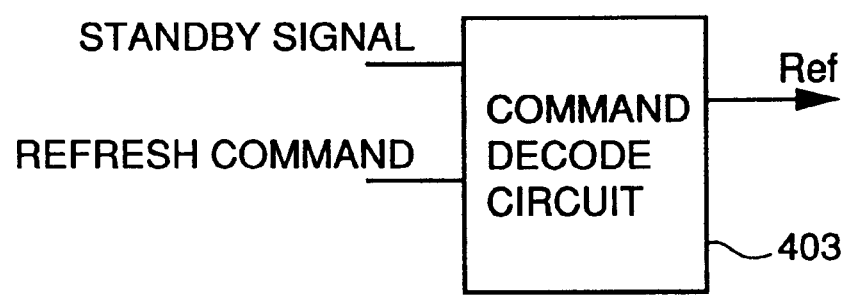
FIG. 14 illustrates a command decode circuit 403 according to the fourth embodiment of the present invention.

The control command signal Ref is output from a command decode circuit 403 shown in FIG. 14, for example. The command decode circuit 403 shown in FIG. 14 receives a refresh command output from a command decoder 12 and an externally input standby signal specifying a standby mode and outputs the control command signal Ref.

Figure 15:
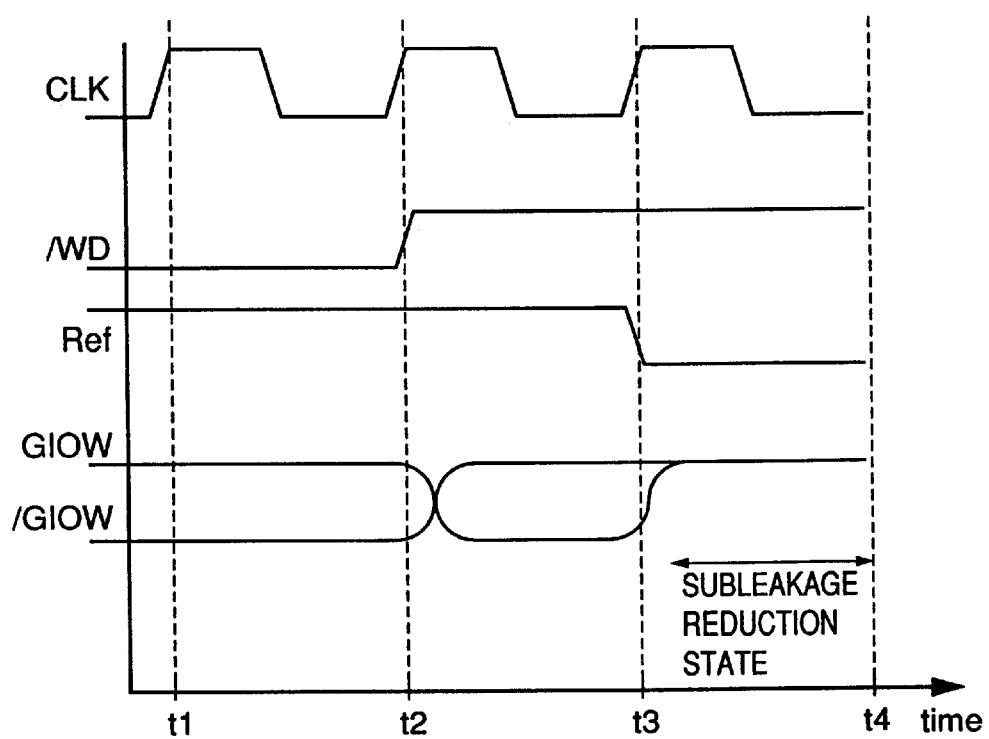
FIG. 15 is a timing chart for illustrating circuit operations according to the fourth embodiment of the present invention.

Operations of the circuit structure according to the fourth embodiment of the present invention are described with reference to FIG. 15. A general write operation is performed between times t1 and t3. Write data /WD goes high at a time t2. The potentials of the pair of write data lines GIOW and /GIOW change in response to this.

A refresh mode or the standby mode is specified at the time t3, and the control command signal Ref goes low, so that the pair of write data lines GIOW and /GIOW are precharged high. Thus, leakage current flows from only a final-stage NMOS transistor.

Thus, the GIO line write driver 400 according to the fourth embodiment of the present invention can suppress generation of leakage current in a PMOS transistor in a final-stage driver part by precharging the pair of write data lines GIOW and /GIOW high in an operation (the refresh mode or the standby mode) other than the general operation.

Therefore, generation of leakage current can be limited to only the NMOS transistor having small subthreshold current in a period when leakage current is generated in the NOS transistor and the PMOS transistor in the final-stage driver part in general.

[Fifth Embodiment]

A fifth embodiment of the present invention relates to another exemplary improvement of the structure according to the first embodiment of the present invention. In write masking, the GIO line write driver 110 according to the first embodiment sets the column selection signal CSLW high after completely precharging the pair of write data lines GIOW and /GIOW high. When setting the column selection signal CSLW high for turning on the write gate halfway the precharging, the potentials of the bit lines BL and /BL may be inverted in response to the potential difference between the write data lines GIOW and /GIOW. If turning on the write gate after completely precharging the write data lines GIOW and /GIOW, however, a high-speed operation is disabled.

According to the fifth embodiment of the present invention, a GIO line write driver 500 driving a pair of write data lines GIOW and /GIOW and a GIO line equalization circuit 502 supporting precharging of the pair of write data lines GIOW and /GIOW only in write masking are arranged through memory cell arrays MA and MB. The GIO line equalization circuit 502 increases the speed for precharging the pair of write data lines GIOW and /GIOW in write masking.

The GIO line write driver 500 includes inverters IV1 to IV3, IV6, IV7 and IV30 to IV33 and NAND circuits NA1, NA2, NA30 and NA31. The connection between the inverters IV1 to IV3, IV6 and IV7 and the NAND circuits NA1 and NA2 is identical to that in the GIO line write driver 350. The NAND circuits NA1 and NA2 receive the output of the inverter IV30 in place of a write mask signal /WM. The write data line GIOW is connected with the output of the inverter IV6, and the write data line /GIOW is connected with the output of the inverter IV7.

The inverter IV30 inverts the output of the NAND circuit NA30. The NAND circuit NA30 receives the write mask signal /WM and a signal /WE in the inputs thereof. The inverter IV31 inverts the write mask signal /WM. The NAND circuit NA31 receives the output of the inverter IV31 and the signal /WE. The inverter IV32 inverts the output of the NAND circuit N31, while the inverter IV33 inverts the output of the inverter IV32 and outputs a signal WMEQ.

Figure 17:
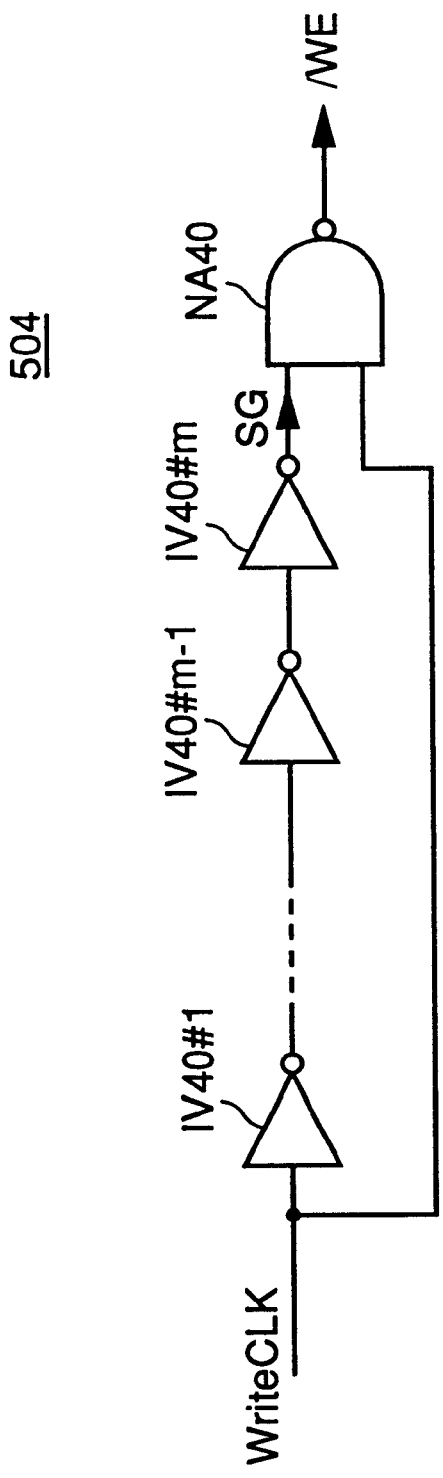
FIG. 17 is a circuit diagram showing an exemplary structure of a one-shot pulse generation circuit 504 according to the fifth embodiment of the present invention.

A one-shot pulse generation circuit 504 generates the signal /WE. As shown in FIG. 17, the one-shot pulse generation circuit 504 includes serially connected inverters IV40#1, . . . , IV40#m–1 and IV40#m and a NAND circuit NA40. The inverter IV40#1 inverts a write clock WriteCLK. The NAND circuit NA40 receives an output SG from the inverter IV40#m and the write clock WriteCLK in the inputs thereof and outputs the signal /WE.

Figure 18:
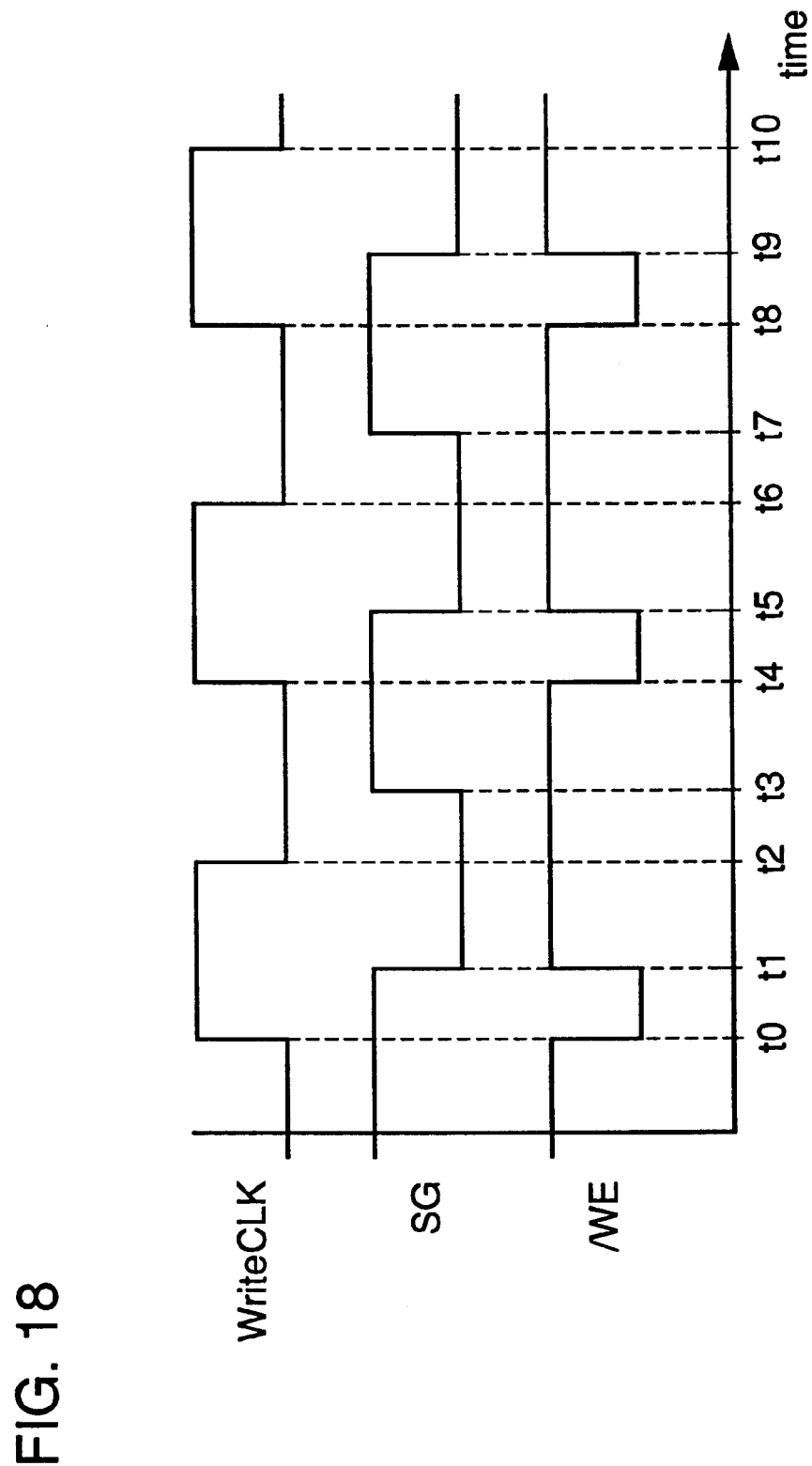
FIG. 18 is a timing chart for illustrating operations of the one-shot pulse generation circuit 504.

Operations of the one-shot pulse generation circuit 504 are described with reference to FIG. 18. As shown in FIG. 18, the plurality of stages of inverters IV40#1 to IV40#m delay the write clock WriteCLK, to output the signal SG. While the write clock WriteCLK is high (times t0 to t2, t4 to t6 and t8 to t10) and the signal SG is high (times t0 to t1, t3 to t5 and t7 to t9), the signal /WE goes low (times t0 to t1, t4 to t5 and t8 to t9).

Figure 19:
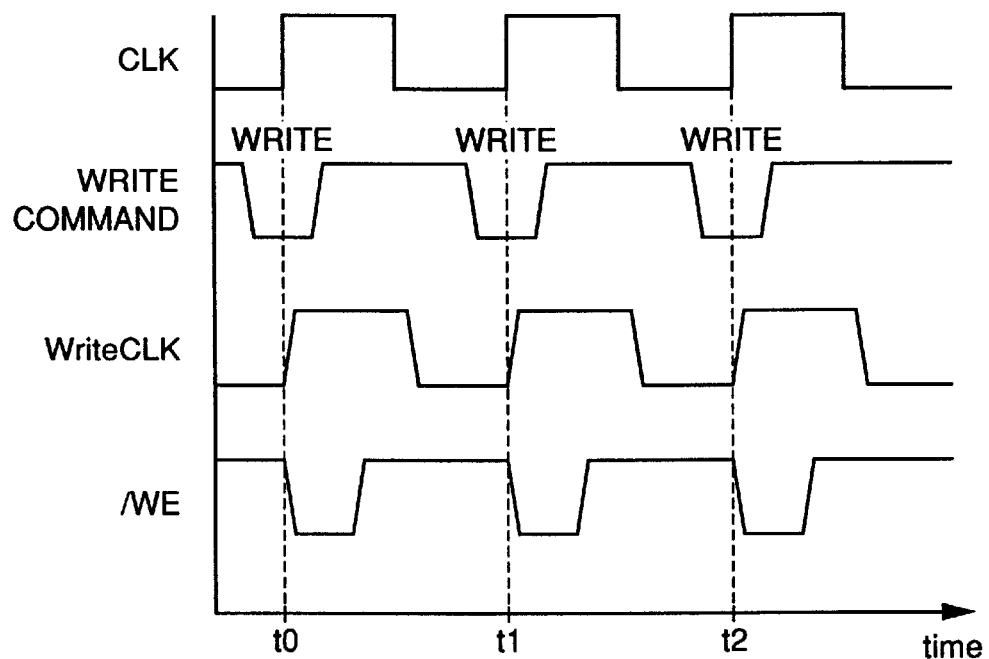
FIG. 19 is a timing chart showing the relation between a write command and a signal WE.

FIG. 19 shows the relation between a write command and the signal /WE. When the write command specifying a write operation is input, the write clock WriteCLK is generated in synchronization with a clock CLK. The one-shot signal /WE is generated at the rise timing of the write clock WriteCLK.

Figure 16:
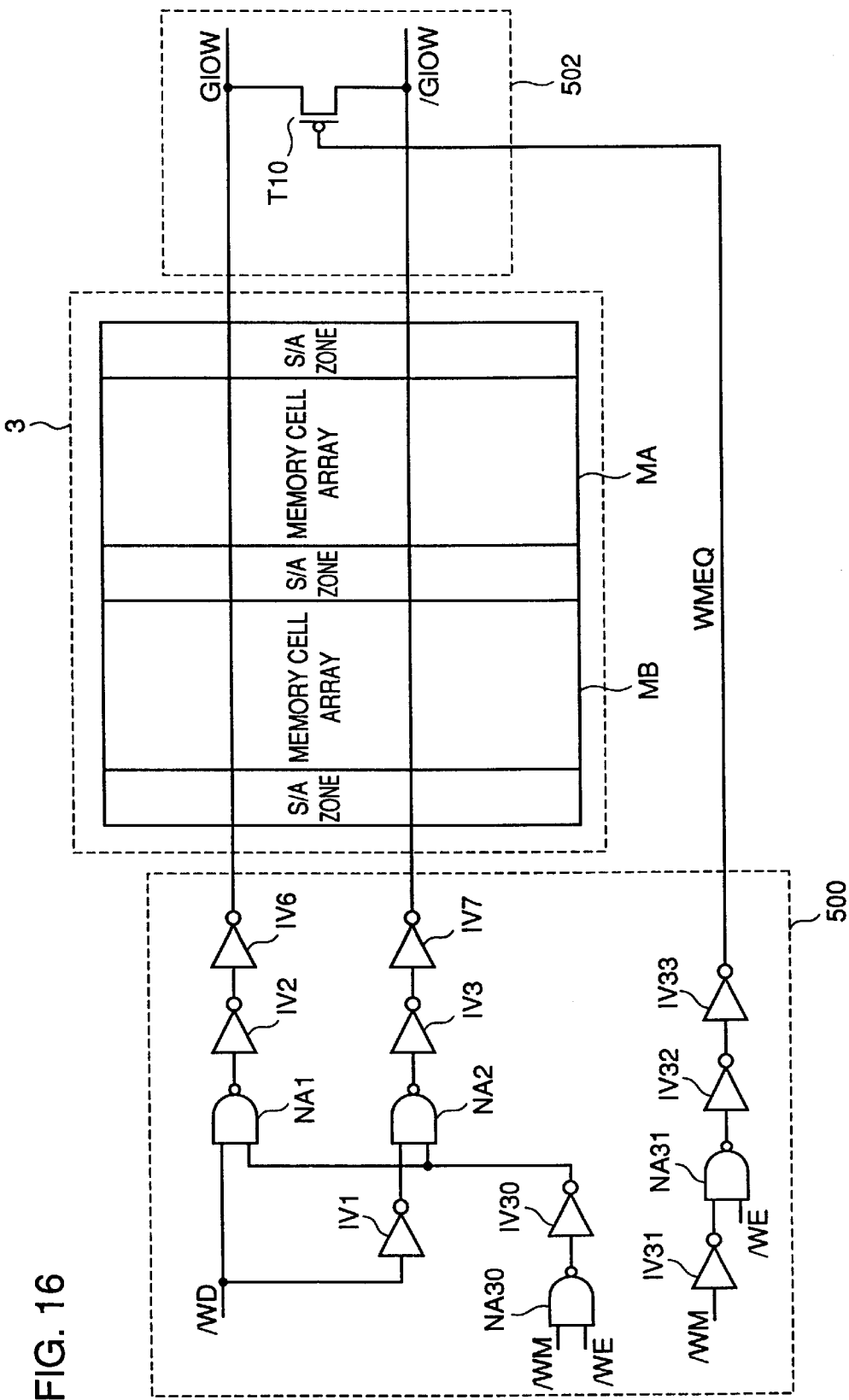
FIG. 16 is a circuit diagram showing exemplary structures of a GIO line write driver 500 and a GIO line equalization circuit 502 according to a fifth embodiment of the present invention.

As shown in FIG. 16, the GIO line equalization circuit 502 includes a PMOS transistor T10 arranged between the write data lines GIOW and /GIOW. The transistor T10 is rendered conductive by the signal WMEQ, for electrically connecting the write data lines GIOW and /GIOW with each other.

Figure 20:
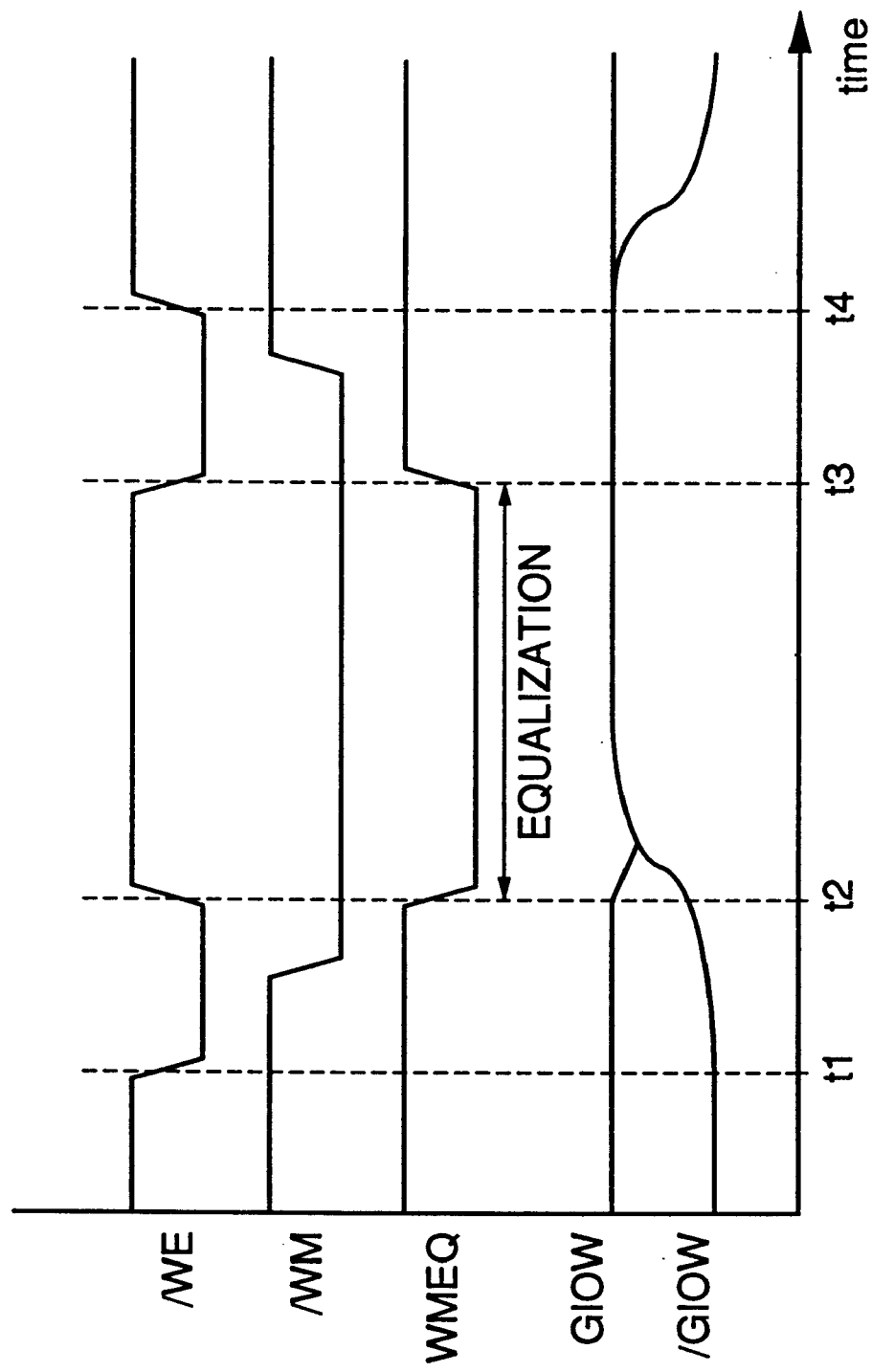
FIG. 20 is a timing chart for illustrating circuit operations according to the fifth embodiment of the present invention.

Circuit operations according to the fifth embodiment of the present invention are described with reference to FIG. 20. The signal /WE goes low at a time t1, and precharging of the pair of write data lines GIOW and /GIOW is started. The write mask signal /WM is set low.

The signal /WE goes high at a time t2, and the signal WMEQ goes low. The precharging is continued. The equalization transistor T10 is turned on with the low-level signal WMEQ. The write data lines GIOW and /GIOW are shorted. Thus, no potential difference is present between the write data lines GIOW and /GIOW.

While the signal WMEQ is low (times t2 to t3), no malfunction takes place to invert the potentials of bit lines and rewrite data also when a column selection signal CSLW goes high to turn on a write gate.

The signal /WE goes low at a time t3, and the signal WMEQ goes high. The equalization transistor T10 is turned off. The write mask signal /WM is set high.

Write data /WD is input at a time t4, and a potential difference is developed between the write data lines GIOW and /GIOW in response to the write data /WD. Data is written in a memory cell in response to this potential difference.

Thus, the GIO line write driver 500 and the GIO line equalization circuit 502 according to the fifth embodiment of the present invention can increase the speed for precharging the write data lines GIOW and /GIOW.

[Sixth Embodiment]

A sixth embodiment of the present invention relates to an exemplary improvement of the structure according to the fifth embodiment of the present invention. In the sixth embodiment of the present invention, a GIO line equalization circuit 602 for precharging a pair of write data lines GIOW and /GIOW at a higher speed is arranged in place of the GIO line equalization circuit 502.

Figure 21:
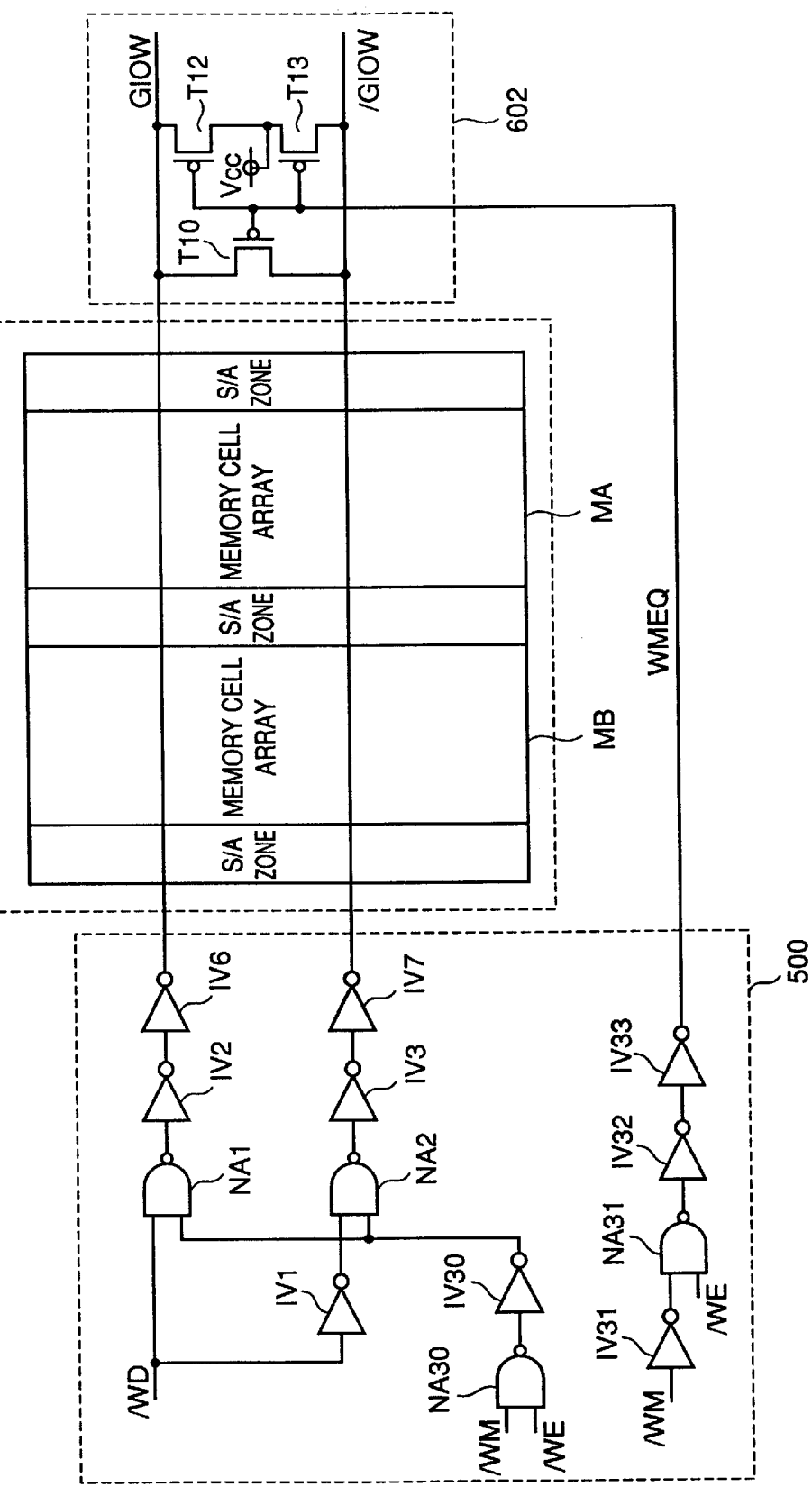
FIG. 21 illustrates an exemplary structure of a GIO line equalization circuit 602 according to a sixth embodiment of the present invention.

As shown in FIG. 21, the GIO line equalization circuit 602 and a GIO line write driver 500 are arranged through memory cell arrays MA and MB. The GIO line equalization circuit 602 includes PMOS transistors T10, T12 and T13. The transistor T10 is connected between the write data lines GIOW and /GIOW, and receives a signal WMEQ in the gate thereof. The transistor T12 is connected between the write data line GIOW and a node receiving a power supply voltage, and receives the signal WMEQ in the gate thereof. The transistor T13 is connected between the write data line /GIOW and the node receiving the power supply voltage Vcc, and receives the signal WMEQ in the gate thereof.

The transistor T10 is rendered conductive by the signal WMEQ, for electrically connecting the write data lines GIOW and /GIOW with each other. The transistor T12 is rendered conductive by the signal WMEQ, for supplying the power supply voltage Vcc to the write data line GIOW. The transistor T13 is rendered conductive by the signal WMEQ, for supplying the power supply voltage Vcc to the write data line /GIOW. The signal WMEQ is identical to that described with reference to the fifth embodiment.

Thus, according to the sixth embodiment of the present invention, the speed for precharging the pair of write data lines GIOW and /GIOW can be further increased.

[Seventh Embodiment]

Figure 22:
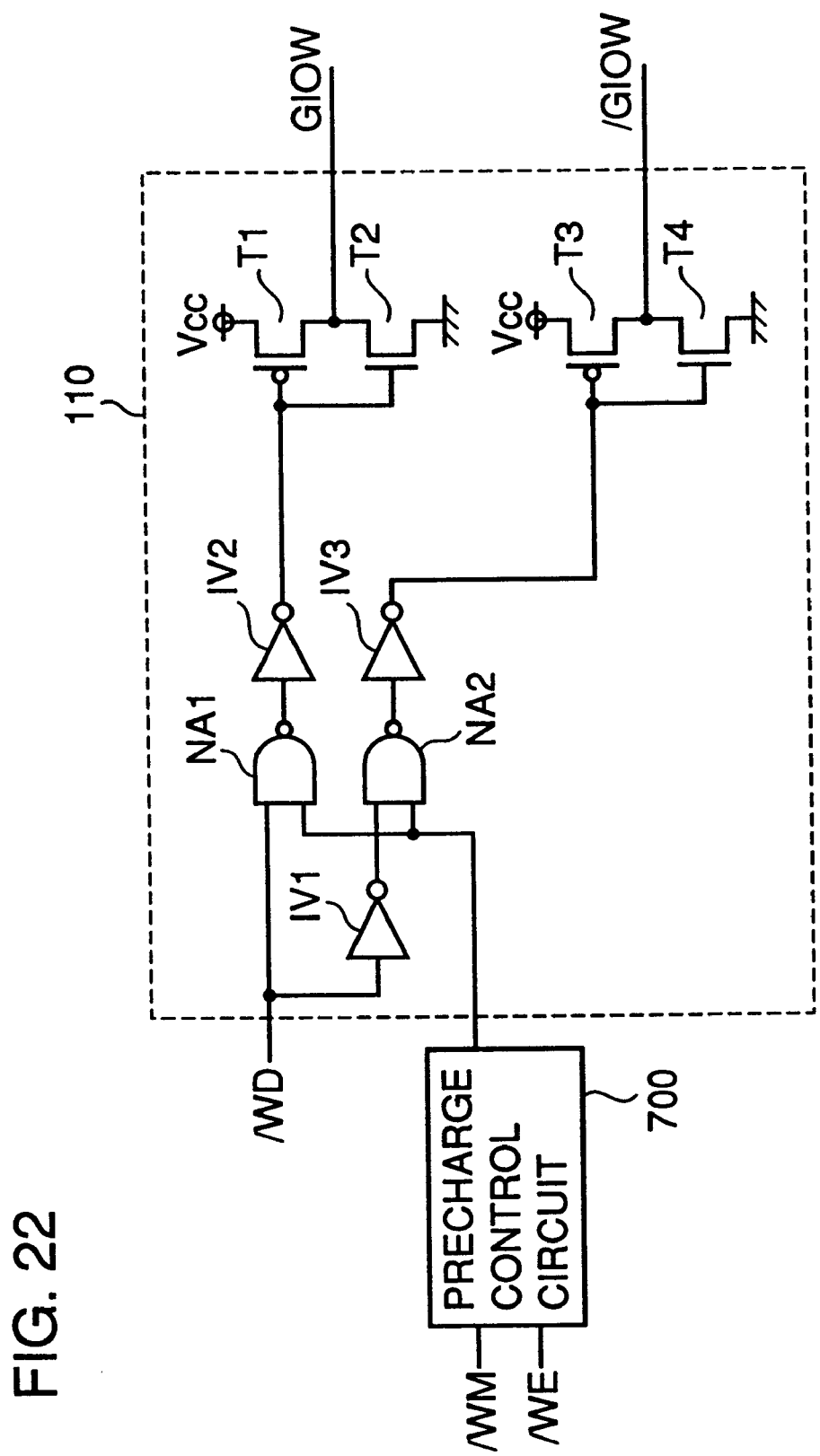
FIG. 22 is a diagram for illustrating a structure according to a seventh embodiment of the present invention.

A seventh embodiment of the present invention relates to an exemplary application of the GIO line write driver 110 according to the first embodiment of the present invention. As shown in FIG. 22, a precharge control circuit 700 is arranged for the GIO line write driver 110. The precharge control circuit 700 receives a write mask signal /WM and a signal /WE in the inputs thereof. The NAND circuit NA1 of the GIO line write driver 110 receives the output of the precharge control circuit 700 and write data /WD in the inputs thereof. The NAND circuit NA2 of the GIO line write driver 110 receives the output of the precharge control circuit 700 and the output of the inverter IV1 inverting the write data /WD in the inputs thereof.

According to the seventh embodiment of the present invention, a pair of write data lines GIOW and /GIOW are precharged with the signal /WE output from the one-shot pulse generation circuit 504. If no low-level write mask signal /WM is subsequently input, the pair of write data lines GIOW and /GIOW are driven on the basis of the write data /WD. If the low-level write mask signal /WM is input, the precharge operation is continued as such.

Figure 23:
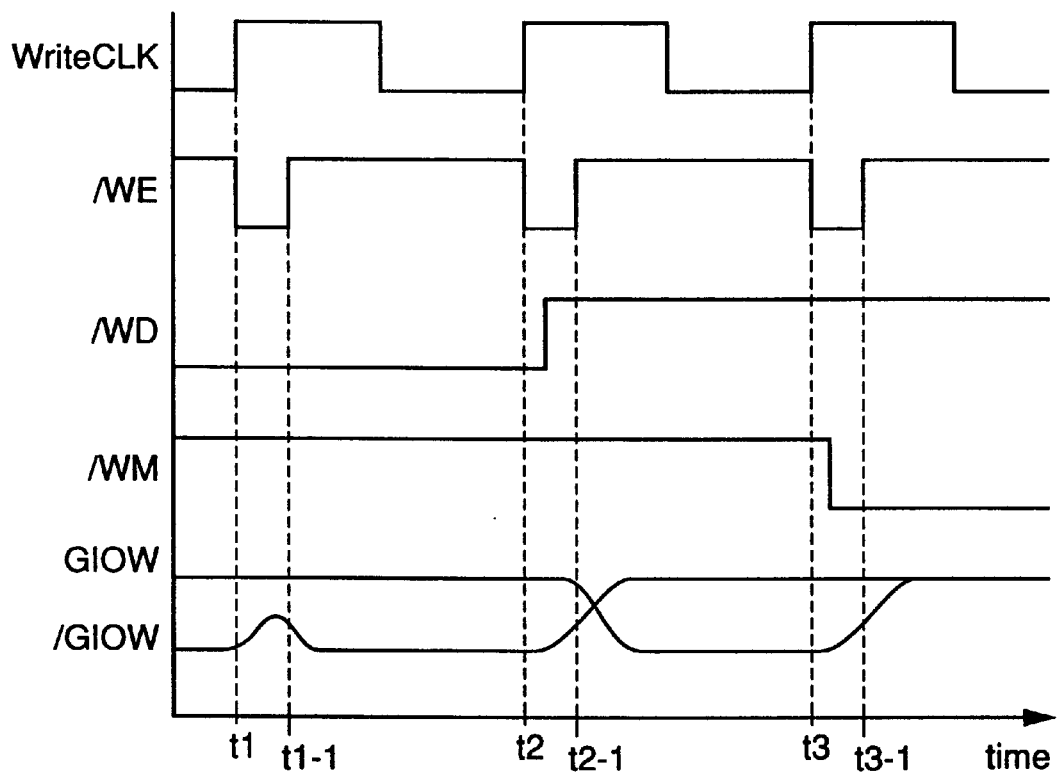
FIG. 23 is a timing chart for illustrating circuit operations according to the seventh embodiment of the present invention.
Figure 24:
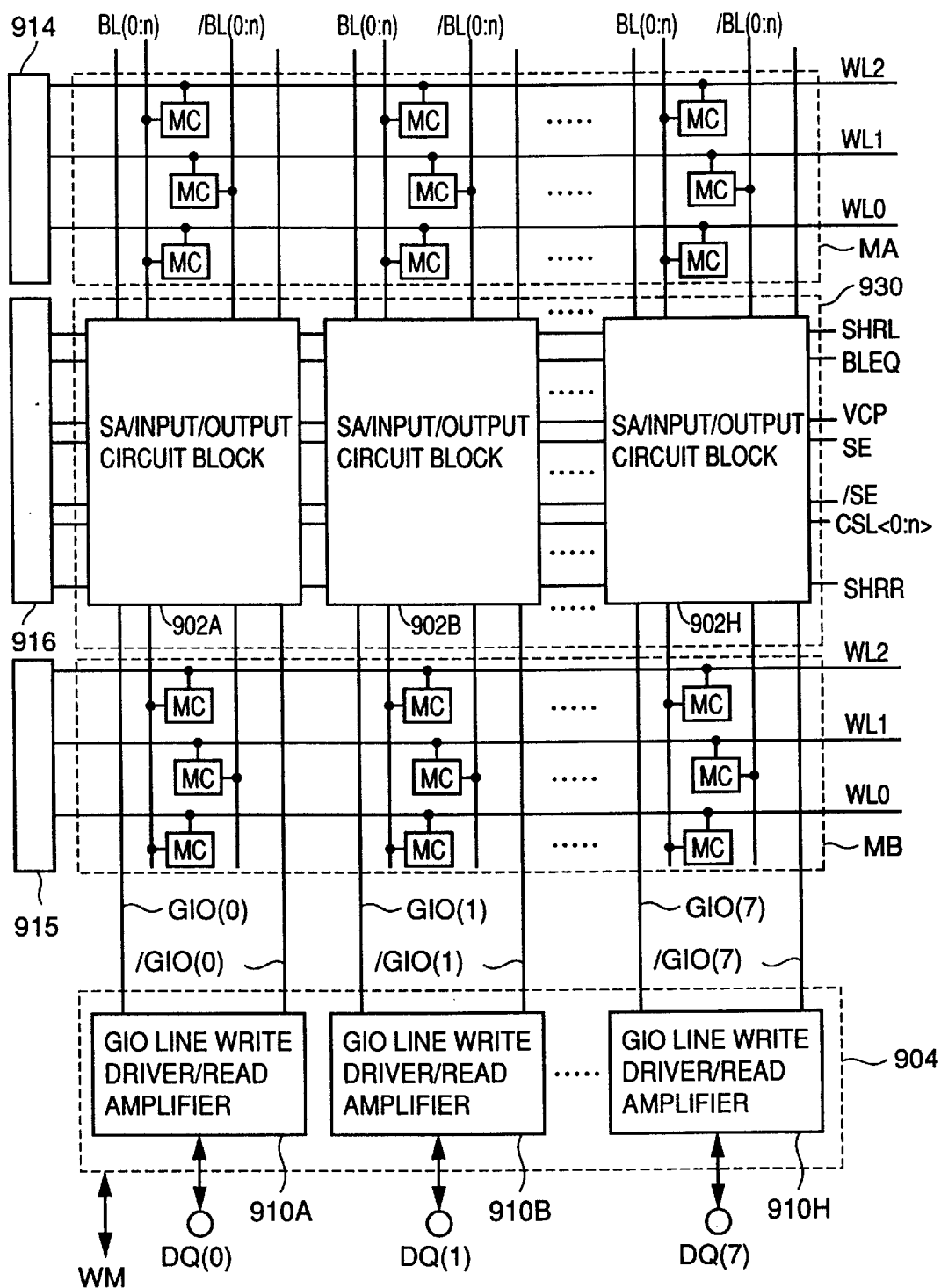
FIGS. 24 and 25 are diagrams for illustrating a principal part of a conventional memory core part.
Figure 25:
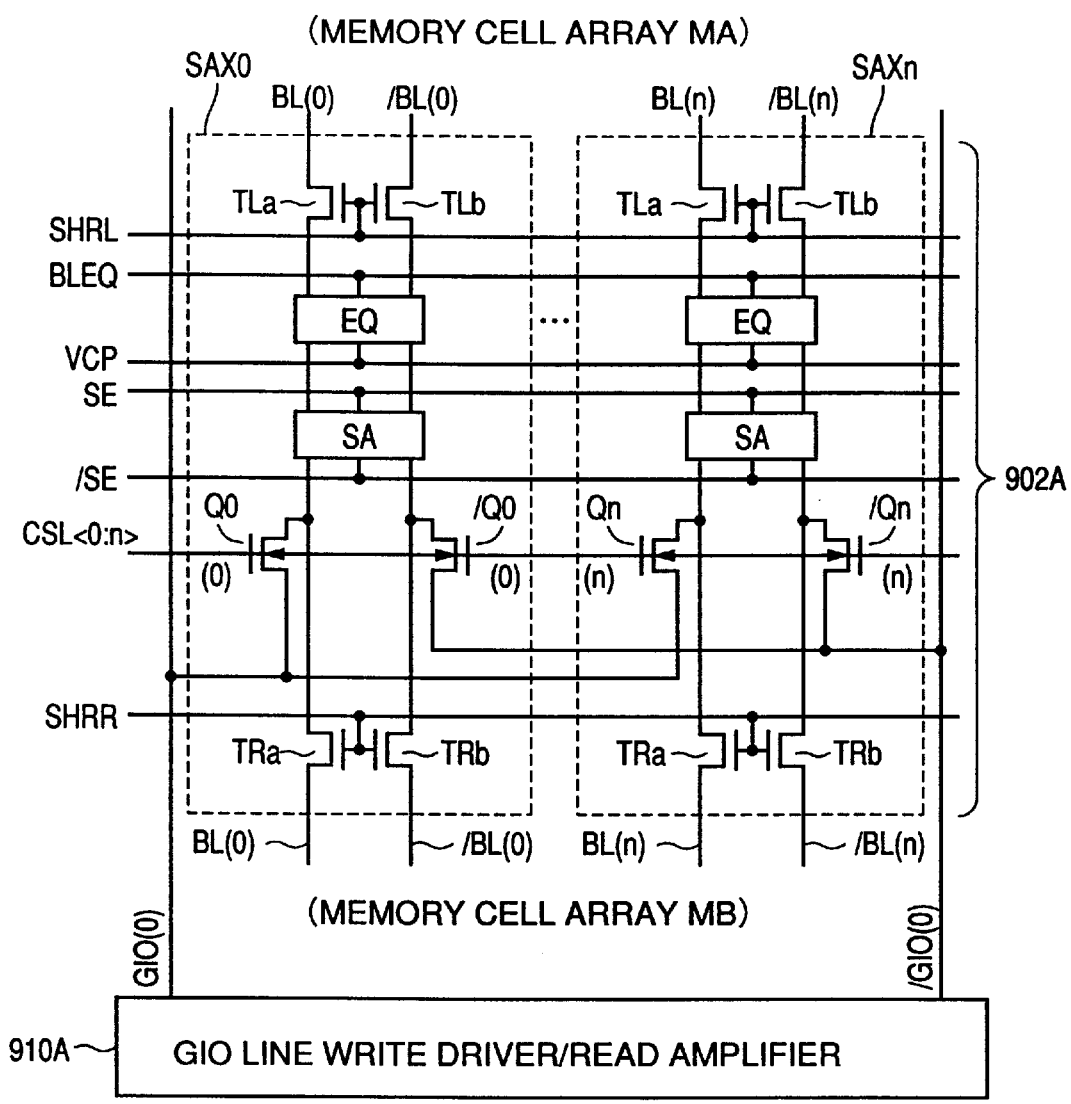
Figure 26:
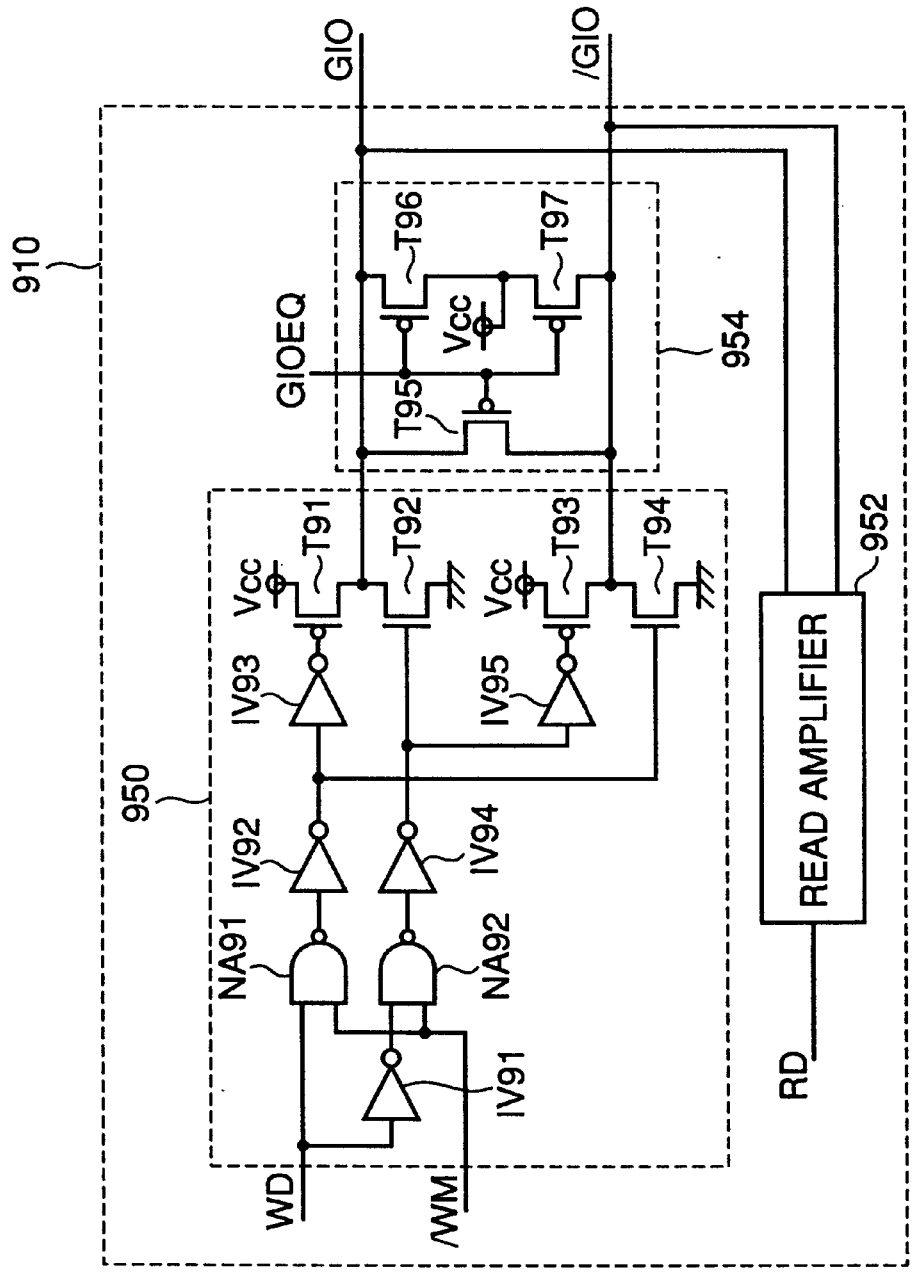
FIG. 26 illustrates the structure of a conventional GIO line write driver/read amplifier.
Figure 27:
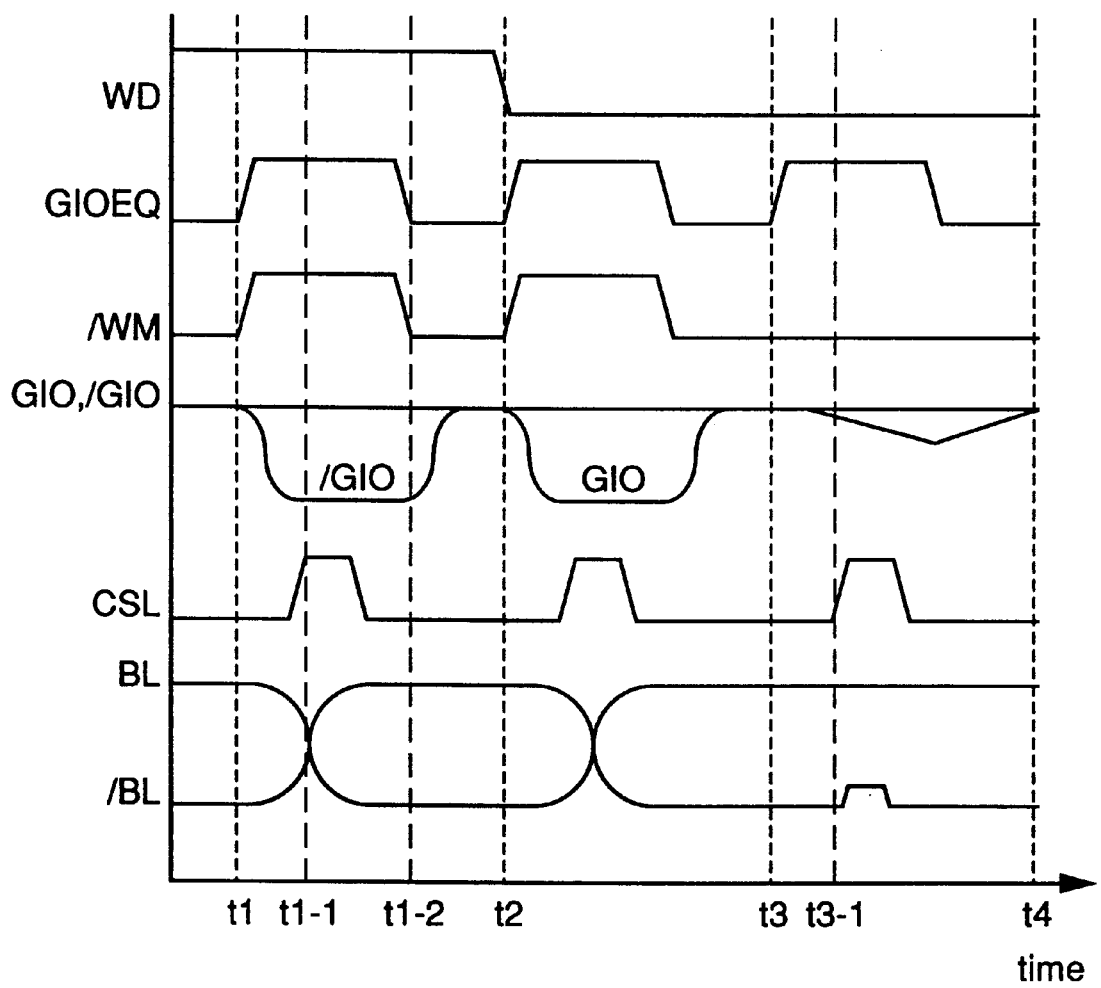
FIG. 27 is a timing chart for illustrating a write/read operation in a conventional semiconductor memory device.

Circuit operations according to the seventh embodiment of the present invention are described with reference to FIG. 23. The signal /WE goes low in synchronization with rise of a write clock WriteCLK at a time t1. The precharge control circuit 700 outputs a low-level signal. Thus, precharging of the pair of write data lines GIOW and /GIOW is started. The signal /WE goes high at a time t1–1, and the precharge control circuit 700 outputs a high-level signal. Thus, the pair of write data lines GIOW and /GIOW return to potentials responsive to the write data /WD.

The signal /WE goes low again in synchronization with rise of the write clock WriteCLK at a time t2. The precharge control signal 700 outputs a low-level signal. Thus, precharging of the pair of write data lines GIOW and /GIOW is started. The write data line /GIOW goes high.

The signal /WE goes high at a time t2–1, and the precharge control circuit 700 outputs a high-level signal. The write data line GIOW goes low in response to the write data /WD. The write data line /GIOW approaching a high level to some extent goes high as such.

The signal /WE goes low again in synchronization with rise of the write clock WriteCLK at a time t3. The precharge control circuit 700 outputs a low-level signal. Thus, precharging of the pair of write data lines GIOW and /GIOW is started. When the write mask signal /WM goes low while the signal /WE is low, the precharge control circuit 700 outputs the low-level signal as such. Thus, the precharge operation is continued. The pair of write data lines GIOW and /GIOW are precharged to some extent at this point of time, and hence the precharging can be completed at a high speed.

Thus, in the structure according to the seventh embodiment of the present invention, precharging of the write data lines GIOW and /GIOW is started every write clock WriteCLK and the precharge operation is continued as such when the write mask signal /WM is subsequently input. If the write data /WD is input after starting precharging, the precharge operation is stopped and the write data lines GIOW and /GIOW are driven on the basis of the write data /WD. Thus, precharging can be completed at a high speed and a malfunction can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array including a plurality of memory cells arranged in rows and columns, a plurality of word lines and a plurality of pairs of bit lines;
   a selection circuit selecting a memory cell subjected to a write operation/read operation from said plurality of memory cells;
   a pair of write data lines for transferring write data to said memory cell array;
   a pair of read data lines for transferring data read from said memory cell array; and
   a write driver driving said pair of write data lines in response to said write data and precharging said pair of write data lines in response to a write mask signal in said write operation.

2. The semiconductor memory device according to claim 1, further comprising:
   a plurality of write gates arranged correspondingly to said plurality of pairs of bit lines for transferring data of said pair of write data lines to the corresponding pairs of bit lines, and
   a plurality of read gates arranged correspondingly to said plurality of pairs of bit lines for transferring data of the corresponding pairs of bit lines to said pair of read data lines, wherein
   said selection circuit outputs a first selection signal for turning on a selected write gate in said write operation while outputting a second selection signal for turning on a selected read gate in said read operation.

3. The semiconductor memory device according to claim 2, further comprising a plurality of sense amplifiers provided in correspondence to said plurality of pairs of bit lines respectively, wherein
   each of said plurality of sense amplifiers decides the potentials of the corresponding pair of bit lines in response to the potential difference between said pair of write data lines when the corresponding write gate is turned on, and decides the potentials of said pair of read data lines in response to the potential difference between the corresponding pair of bit lines when the corresponding read gate is turned on.

4. The semiconductor memory device according to claim 2, further comprising an equalization circuit for equalizing said pair of read data lines.

5. The semiconductor memory device according to claim 2, further comprising:
   a clock generation circuit receiving an external clock and generating an internal clock controlling an internal operation, and
   a write mask circuit settling said write mask signal asynchronously with said internal clock during a setup period preceding an edge of said internal clock, wherein
   said write driver receives the output of said write mask circuit and precharges said pair of write data lines.

6. The semiconductor memory device according to claim 1, wherein
   said pair of write data lines include:
   a first pair of write data lines, and
   a second pair of write data lines,
   said plurality of pairs of bit lines include:
   a first pair of bit lines, and
   a second pair of bit lines,
   said semiconductor memory device further comprises:
   a first write gate for transferring data of said first pair of write data lines to said first pair of bit lines, and a second write gate for transferring data of said second pair of write data lines to said second pair of bit lines, said selection circuit includes:
- a circuit outputting a column address signal in response to an address signal, and
- a circuit outputting a signal for turning on said first write gate and said second write gate in response to said column address signal in said write operation, and
- said write driver precharges said second pair of write data lines when said first pair of bit lines are selected while precharging said first pair of write data lines when said second pair of bit lines are selected on the basis of said column address signal.

7. The semiconductor memory device according to claim 6, further comprising:

a first sense amplifier provided in correspondence to said first pair of bit lines, and a second sense amplifier provided in correspondence to said second pair of bit lines, wherein
- said first sense amplifier decides the potentials of said first pair of bit lines in response to the potential difference between said first pair of write data lines when said first write gate is turned on, and
- said second sense amplifier decides the potentials of said second pair of bit lines in response to the potential difference between said second pair of write data lines when said second write gate is turned on.

8. The semiconductor memory device according to claim 1, further comprising a precharge control circuit generating a precharge control signal for precharging said write data at prescribed timing, wherein said write driver precharges said pair of write data lines high in response to said write mask signal and said precharge control signal.

9. The semiconductor memory device according to claim 8, wherein said pair of write data lines include:
- a first write data line, and
- a second write data line,
- said prescribed timing is in a refresh mode for refreshing said memory cell array, and
- said write driver includes:
  - a PMOS transistor connected between a first power supply voltage and said first write data line and controlled on/off in response to said write data, said write mask signal and said precharge control signal, and
  - an NMOS transistor connected between a second power supply voltage lower than said first power supply voltage and said second write data line and controlled on/off in response to said write data, said write mask signal and said precharge control signal.

10. The semiconductor memory device according to claim 8, wherein said pair of write data lines include:
a first write data line, and
a second write data line,
said prescribed timing is in a standby mode stopping said write operation/read operation of said memory cell array, and
said write driver includes:
- a PMOS transistor connected between a first power supply voltage and said first write data line and controlled on/off in response to said write data, said write mask signal and said precharge control signal, and
- an NMOS transistor connected between a second power supply voltage lower than said first power supply voltage and said second write data line and controlled on/off in response to said write data, said write mask signal and said precharge control signal.

11. The semiconductor memory device according to claim 1, further comprising:

an equalization circuit for equalizing said pair of write data lines in response to said write mask signal.

12. The semiconductor memory device according to claim 11, wherein said pair of write data lines include:
- a first write data line, and
- a second write data line, and
- said equalization circuit includes a switch electrically connecting said first write data line with said second write data line in response to said write mask signal.

13. The semiconductor memory device according to claim 11, wherein said pair of write data lines include:
- a first write data line, and
- a second write data line, and
- said equalization circuit includes a switch supplying a power supply voltage to said first write data line and said second write data line in response to said write mask signal.

14. The semiconductor memory device according to claim 1, further comprising:

a control circuit controlling said write driver to start precharging said pair of write data lines when starting said write operation and continue said precharging when said write mask signal is subsequently input.

15. The semiconductor memory device according to claim 14, wherein said control circuit controls said write driver to start precharging said pair of write data lines when starting said write operation and stop said precharging for driving said pair of write data lines on the basis of said write data when said write mask signal is not subsequently input.

16. A semiconductor memory device comprising:

a memory cell array including a plurality of memory cells arranged in rows and columns, a plurality of word lines and a plurality of pairs of bit lines;

columns, a plurality of word lines and a memory cell from said plurality of memory cells;

a pair of data lines for transferring data to/from said memory cell array;

a write driver driving said pair of data lines in response to said data and precharging said pair of data lines in response to a write mask signal.

17. The semiconductor memory device according to claim 16, wherein said pair of data lines holds a write state of the preceeding cycle and is precharged in response to said write mask signal.

18. The semiconductor memory device according to claim 16, wherein said memory cell array further comprises a column selection line, and said pair of data lines is arranged perpendicular to said column selection line.

19. The semiconductor memory device according to claim 16, wherein the precharge level attained in response to said write mask signal is changed in accordance with said data.

20. The semiconductor memory device according to claim 16, wherein said pair of data lines is precharged in response to said write mask signal and a read command signal

* * * * *